(12) United States Patent
Watanabe et al.

(10) Patent No.: US 11,018,148 B2
(45) Date of Patent: May 25, 2021

(54) SEMICONDUCTOR MEMORY DEVICE AND METHOD FOR MANUFACTURING SAME

(71) Applicant: Toshiba Memory Corporation, Minato-ku (JP)

(72) Inventors: Yuta Watanabe, Yokkaichi (JP); Fumitaka Arai, Yokkaichi (JP); Katsuyuki Sekine, Yokkaichi (JP); Toshiyuki Iwamoto, Mie (JP); Wataru Sakamoto, Yokkaichi (JP); Tatsuya Kato, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/704,758

(22) Filed: Sep. 14, 2017

(65) Prior Publication Data

US 2018/0006050 A1     Jan. 4, 2018

Related U.S. Application Data

(63) Continuation of application No. PCT/JP2015/066263, filed on Jun. 4, 2015.

(51) Int. Cl.
*H01L 27/11556*     (2017.01)
*H01L 21/28*         (2006.01)
(Continued)

(52) U.S. Cl.
CPC .. *H01L 27/11556* (2013.01); *H01L 21/02636* (2013.01); *H01L 21/31111* (2013.01);
(Continued)

(58) Field of Classification Search
CPC ......... H01L 27/11556; H01L 21/28273; H01L 29/1037; H01L 21/02636; H01L 21/31111;
(Continued)

(56) References Cited

U.S. PATENT DOCUMENTS 9,166,032 B1 * 10/2015 Higuchi .............. H01L 21/0262
9,257,443 B1 *  2/2016 Kikushima ....... H01L 27/11556
(Continued)

FOREIGN PATENT DOCUMENTS

| JP | 4-364786 | 12/1992 |
|----|----------|---------|
| JP | 2010-140996 | 6/2010 |

(Continued)

OTHER PUBLICATIONS

International Search Report dated Aug. 25, 2015 in PCT/JP2015/066263, filed on Jun. 4, 2015 (with English Translation).
(Continued)

*Primary Examiner* — Bitew A Dinke
(74) *Attorney, Agent, or Firm* — Oblon, McClelland, Maier & Neustadt, L.L.P.

(57) ABSTRACT

A semiconductor memory device according to an embodiment, includes a semiconductor pillar extending in a first direction, a first electrode extending in a second direction crossing the first direction, a second electrode provided between the semiconductor pillar and the first electrode, a first insulating film provided between the semiconductor pillar and the second electrode, and a second insulating film provided between the first electrode and the second electrode. The second electrode includes a thin sheet portion disposed on the first electrode side, and a thick sheet portion disposed on the semiconductor pillar side. A length in the first direction of the thick sheet portion is longer than a length in the first direction of the thin sheet portion.

11 Claims, 35 Drawing Sheets

(51) Int. Cl.
  *H01L 29/788* (2006.01)
  *H01L 21/02* (2006.01)
  *H01L 21/311* (2006.01)
  *H01L 29/10* (2006.01)
  *H01L 21/285* (2006.01)
  *H01L 21/3065* (2006.01)

(52) U.S. Cl.
  CPC .... *H01L 29/1037* (2013.01); *H01L 29/40114* (2019.08); *H01L 29/7889* (2013.01); *H01L 21/0262* (2013.01); *H01L 21/02148* (2013.01); *H01L 21/02164* (2013.01); *H01L 21/02532* (2013.01); *H01L 21/02592* (2013.01); *H01L 21/28568* (2013.01); *H01L 21/3065* (2013.01); *H01L 29/7883* (2013.01)

(58) Field of Classification Search
  CPC ........... H01L 29/7889; H01L 21/02164; H01L 21/02592; H01L 29/7883; H01L 21/3065; H01L 21/28568; H01L 21/0262; H01L 21/02148; H01L 21/02532
  See application file for complete search history.

(56) References Cited

U.S. PATENT DOCUMENTS

| | | | |
|---|---|---|---|
| 9,620,515 B2* | 4/2017 | Nagashima | H01L 27/11556 |
| 2010/0140682 A1 | 6/2010 | Kamioka et al. | |
| 2010/0163968 A1 | 7/2010 | Kim et al. | |
| 2010/0207190 A1* | 8/2010 | Katsumata | G11C 16/0483 257/319 |
| 2011/0049612 A1 | 3/2011 | Higuchi et al. | |
| 2011/0193153 A1* | 8/2011 | Higuchi | H01L 27/11582 257/324 |
| 2012/0001247 A1 | 1/2012 | Alsmeier | |
| 2012/0069660 A1 | 3/2012 | Iwai et al. | |
| 2012/0132981 A1* | 5/2012 | Imamura | H01L 27/11556 257/321 |
| 2012/0217564 A1* | 8/2012 | Tang | H01L 27/11524 257/315 |
| 2012/0326221 A1* | 12/2012 | Sinha | H01L 21/31111 257/315 |
| 2013/0200450 A1 | 8/2013 | Kusai et al. | |
| 2013/0207225 A1 | 8/2013 | Sakui | |
| 2014/0070302 A1* | 3/2014 | Yoo | H01L 27/1157 257/324 |
| 2014/0252443 A1* | 9/2014 | Kawai | H01L 27/1157 257/314 |
| 2014/0264532 A1* | 9/2014 | Dennison | H01L 29/66833 257/316 |
| 2014/0339624 A1* | 11/2014 | Ramaswamy | H01L 29/792 257/326 |
| 2015/0001460 A1* | 1/2015 | Kim | H01L 27/11519 257/5 |
| 2015/0076584 A1* | 3/2015 | Pachamuthu | H01L 27/11524 257/315 |
| 2015/0140797 A1 | 5/2015 | Hopkins et al. | |
| 2015/0179790 A1* | 6/2015 | Hopkins | H01L 29/66825 257/315 |
| 2015/0200199 A1* | 7/2015 | Sakamoto | H01L 27/11582 257/329 |
| 2015/0371709 A1* | 12/2015 | Kai | G11C 16/0425 365/185.17 |
| 2015/0372002 A1* | 12/2015 | Higuchi | H01L 27/11556 257/324 |
| 2016/0336336 A1* | 11/2016 | Nagashima | H01L 27/11556 |
| 2017/0373082 A1* | 12/2017 | Sekine | H01L 29/515 |

FOREIGN PATENT DOCUMENTS

| | | |
|---|---|---|
| JP | 2010-157734 | 7/2010 |
| JP | 2011-49239 | 3/2011 |
| JP | 2012-69606 | 4/2012 |
| JP | 2013-161920 | 8/2013 |
| JP | 2013-534058 | 8/2013 |
| JP | 2014-509454 | 4/2014 |

OTHER PUBLICATIONS

Written Opinion dated Aug. 25, 2015 in PCT/JP2015/066263, filed on Jun. 4, 2015.

\* cited by examiner

SEMICONDUCTOR MEMORY DEVICE AND METHOD FOR MANUFACTURING SAME

CROSS-REFERENCE TO RELATED APPLICATION

This is a continuation application of International Application PCT/JP2015/066263, filed on Jun. 4, 2015; the entire contents of which are incorporated herein by reference.

FIELD

Embodiments relate to a semiconductor memory device and a method for manufacturing the same.

BACKGROUND

Conventionally, in NAND flash memory, the bit cost has been reduced by increasing the integration by downscaling the planar structure; but the downscaling of the planar structure is approaching a limit. Therefore, in recent years, technology has been proposed to stack the memory cells in the vertical direction. However, the reliability is a challenge for such a stacked type memory device.

DETAILED DESCRIPTION

A semiconductor memory device according to an embodiment, includes a semiconductor pillar extending in a first direction, a first electrode extending in a second direction crossing the first direction, a second electrode provided between the semiconductor pillar and the first electrode, a first insulating film provided between the semiconductor pillar and the second electrode, and a second insulating film provided between the first electrode and the second electrode. The second electrode includes a thin sheet portion disposed on the first electrode side, and a thick sheet portion disposed on the semiconductor pillar side. A length in the first direction of the thick sheet portion is longer than a length in the first direction of the thin sheet portion.

A method for manufacturing a semiconductor memory device according to an embodiment, includes stacking an inter-layer insulating film and a first film alternately along a first direction. The method includes forming a trench extending in a second direction and piercing the inter-layer insulating film and the first film. The second direction crosses the first direction. The method includes forming a first recess in a side surface of the trench by removing a portion of the first film via the trench. The method includes forming a first insulating layer on the side surface of the trench and on an inner surface of the first recess. The method includes forming a first conductive film on the first insulating layer inside the first recess. The method includes performing etch-back of the first insulating layer to remove a portion of the first insulating layer disposed on the side surface of the trench, remove a portion of the first insulating layer disposed on the trench side of the first recess, and cause a portion of the first insulating layer disposed on an inner portion of the first recess to remain. The method includes forming a second conductive film inside the first recess. The method includes forming a first insulating film on the side surface of the trench. The method includes forming a semiconductor film on a side surface of the first insulating film. The method includes forming a slit extending in the second direction and piercing the inter-layer insulating film and the first film. The method includes forming a second recess in a side surface of the slit by removing the first film via the slit. The method includes forming a second insulating layer on an inner surface of the second recess. The method includes forming a first electrode inside the second recess. The method includes dividing the semiconductor film, the first insulating film, the second conductive film, and the first conductive film along the second direction.

First Embodiment

First, a first embodiment will be described.

Figure 1A:
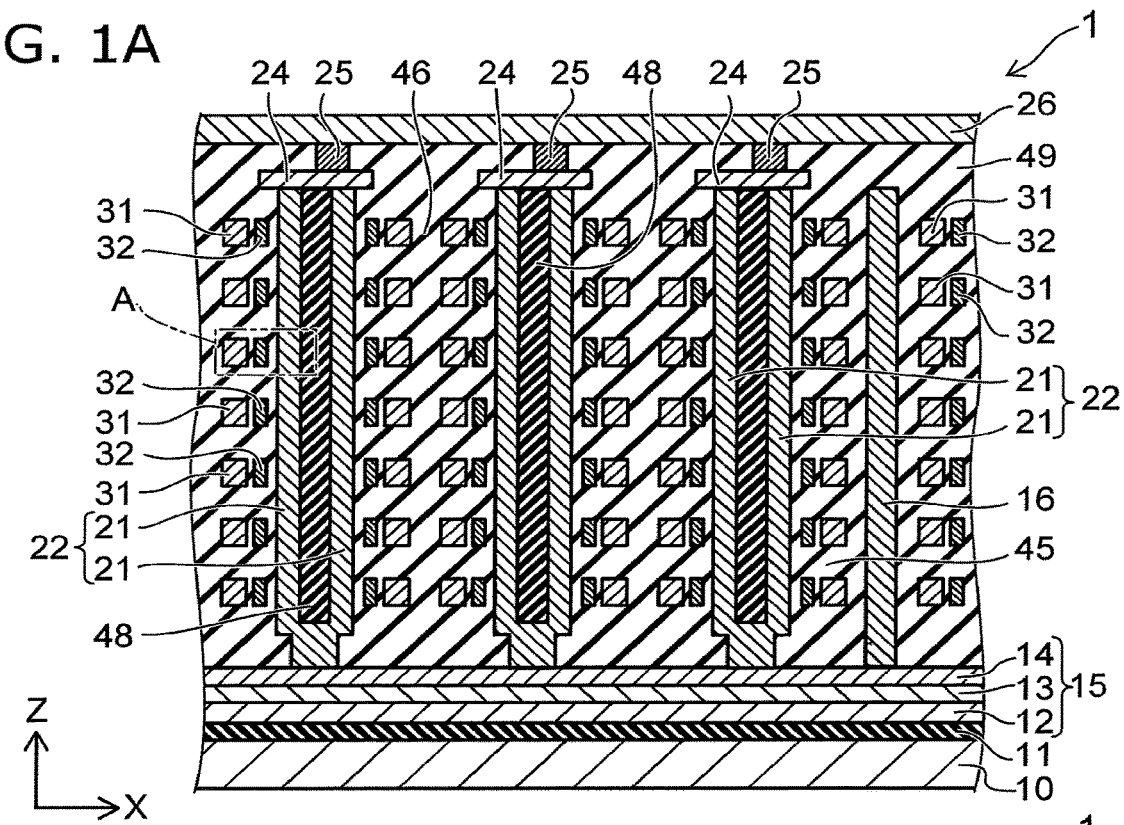
FIG. 1A is a cross-sectional view showing a semiconductor memory device according to a first embodiment.
Figure 1B:
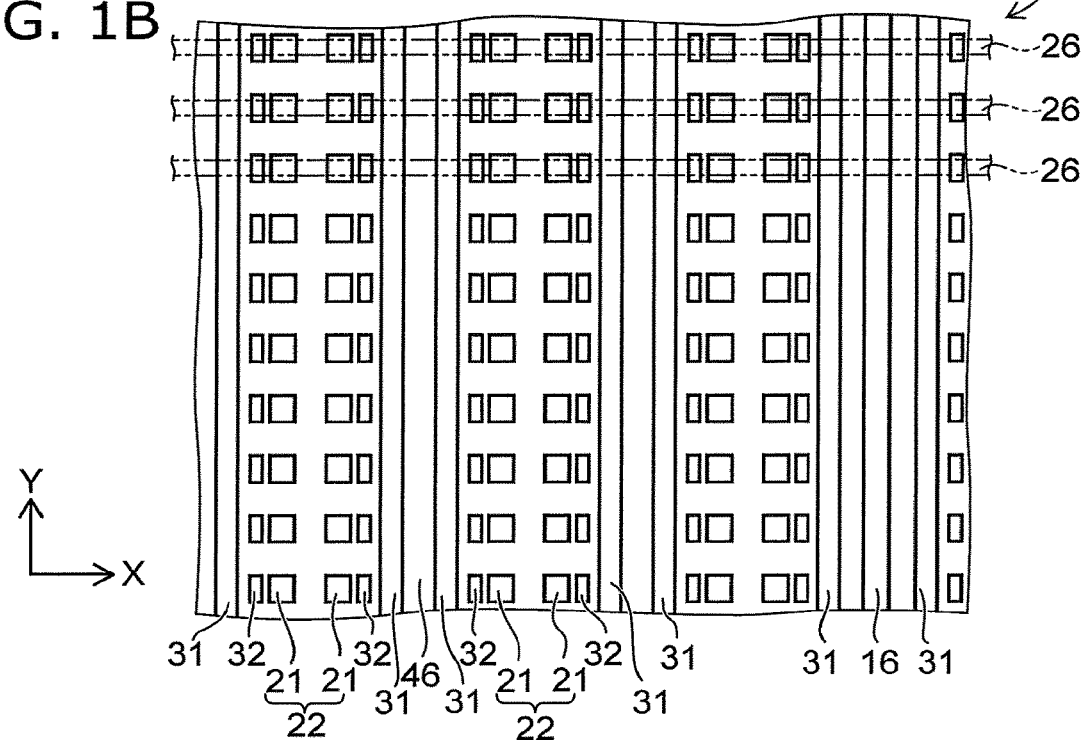
FIG. 1B is a plan view thereof.

FIG. 1A is a cross-sectional view showing a semiconductor memory device according to the embodiment; and FIG. 1B is a plan view of the semiconductor memory device according to the embodiment.

Figure 2:
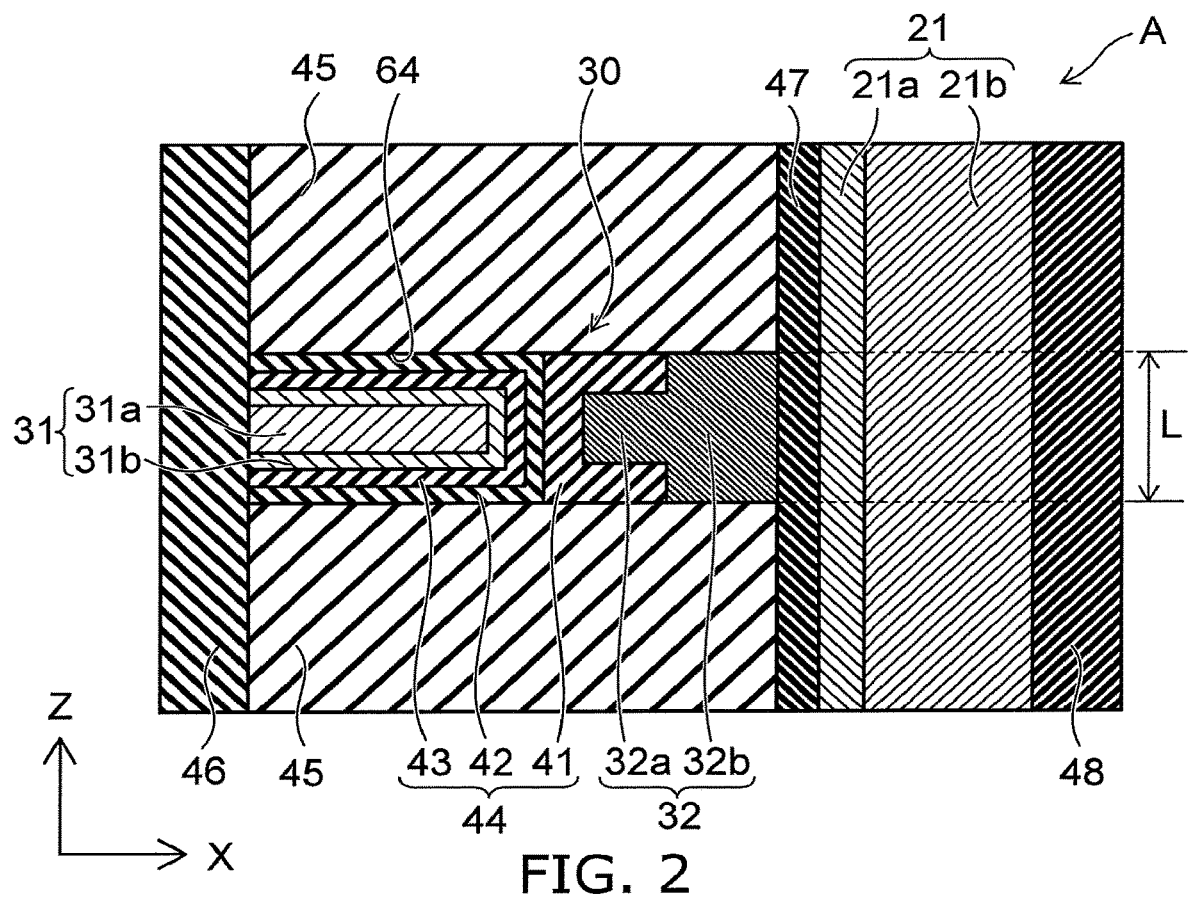
FIG. 2 is a partially enlarged cross-sectional view showing region A of FIG. 1A.

FIG. 2 is a partially enlarged cross-sectional view showing region A of FIG. 1A.

First, the schematic configuration of the semiconductor memory device 1 according to the embodiment will be described.

As shown in FIG. 1A and FIG. 1B, a silicon substrate 10 is provided in the semiconductor memory device 1. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction perpendicular to the upper surface is taken as a "Z-direction." The Z-direction also is called the "vertical direction."

An insulating film 11 that is made of, for example, silicon oxide, a conductive layer 12 that is made of, for example, polysilicon, an interconnect layer 13 that is made of, for example, tungsten, and a conductive layer 14 that is made of, for example, polysilicon are stacked in this order on the silicon substrate 10. A cell source line 15 is formed of the conductive layer 12, the interconnect layer 13, and the conductive layer 14. The cell source line 15 spreads along the XY plane.

Multiple silicon pillars 21 that extend in the Z-direction are provided on the cell source line 15. The silicon pillars 21 are arranged in a matrix configuration along the X-direction and the Y-direction. The lower end portions of two silicon pillars 21 adjacent to each other in the X-direction are connected to each other; and the lower end portions are connected to the cell source line 15. Hereinbelow, the two silicon pillars 21 of which the lower end portions are connected to each other are called a "pillar pair 22."

A connection member 24 that has the X-direction as the longitudinal direction is provided on the pillar pair 22 and is connected to the upper end portions of the two silicon pillars 21 included in the pillar pair 22. A plug 25 is provided on the connection member 24; and multiple bit lines 26 that extend in the X-direction are provided on the plugs 25. The connection members 24, the plugs 25, and the bit lines 26 are formed of, for example, tungsten (W). Each of the bit lines 26 is connected via the plugs 25 and the connection members 24 to the multiple silicon pillars 21 arranged in one column along the X-direction. Therefore, each of the silicon pillars 21 is connected between the bit line 26 and the cell source line 15.

Because FIG. 1A and FIG. 1B are drawings showing the general concept of the device, only some of the major members are shown; and the others are not illustrated. For example, in FIG. 1B, the plugs 25 and the connection members 24 are not illustrated; only some of the bit lines 26 are shown by double dot-dash lines; and the remaining bit lines 26 are not illustrated. Also, the configurations of the major members are drawn as being simplified.

Multiple control gate electrodes 31 that extend in the Y-direction are provided on the cell source line 15. As described below, the control gate electrodes 31 are formed of a metal such as tungsten, etc. The control gate electrodes 31 are arranged in one column along the Z-direction on each of the two X-direction sides of the pillar pairs 22 arranged in one column along the Y-direction. Also, one unit includes the multiple pairs of pillar pairs 22 arranged in one column along the Y-direction and the multiple control gate electrodes 31 arranged in one column along the Z-direction on each of the two X-direction sides of the multiple pairs of pillar pairs 22. In other words, the two control gate electrodes 31 and the two silicon pillars 21 included in the pillar pair 22 are arranged alternately along the X-direction.

A floating gate electrode 32 is provided between each of the silicon pillars 21 and each of the control gate electrodes 31. The floating gate electrode 32 is insulated from the periphery, is a conductive member that stores charge, and is formed of, for example, polysilicon (Si). The floating gate electrode 32 is disposed at each crossing portion between the silicon pillars 21 and the control gate electrodes 31. In other words, the multiple floating gate electrodes 32 are arranged in a matrix configuration separated from each other along the Y-direction and the Z-direction between a column of the silicon pillars 21 arranged in one column along the Y-direction and a column of the control gate electrodes 31 arranged in one column along the Z-direction. Because the silicon pillars 21 and the control gate electrodes 31 are arranged also along the X-direction, the floating gate electrodes 32 are arranged in a three-dimensional matrix configuration along the X-direction, the Y-direction, and the Z-direction. Also, as described below, an insulating material is filled between the cell source line 15, the silicon pillars 21, the control gate electrodes 31, the floating gate electrodes 32, and the bit lines 26.

As shown in FIGS. 1A and 1B, no control gate electrode 31 is provided between the semiconductor pillars 21.

The configuration of the crossing portion between each of the silicon pillars 21 and each of the control gate electrodes 31 of the semiconductor memory device 1 will now be described in detail.

As shown in FIG. 2, a main portion 31a that is made of, for example, tungsten and a barrier metal layer 31b that is made of, for example, titanium nitride (TiN) are provided in the control gate electrode 31. The barrier metal layer 31b covers the side surface of the main portion 31a on the floating gate electrode 32 side, the upper surface of the main portion 31a, and the lower surface of the main portion 31a. The configuration of the control gate electrode 31 is a rectangle when viewed from the Y-direction.

On the other hand, the configuration of the floating gate electrode 32 is a T-shaped configuration when viewed from the Y-direction. In other words, in the floating gate electrode 32, a thin sheet portion 32a that is disposed on the control gate electrode 31 side and has a relatively thin thickness in the Z-direction is formed as one body with a thick sheet portion 32b that is disposed on the silicon pillar 21 side and has a relatively thick thickness in the Z-direction. As described above, although the floating gate electrode 32 is divided along the Y-direction every silicon pillar 21, the length in the Y-direction of the thin sheet portion 32a and the length in the Y-direction of the thick sheet portion 32b are equal to each other.

Also, a high dielectric constant layer 41 that is made of, for example, hafnium silicon nitride (HfSiO), an insulating layer 42 that is made of, for example, silicon oxide ($SiO_2$), and a high dielectric constant layer 43 that is made of, for example, hafnium silicon nitride (HfSiO) are stacked in this order between the floating gate electrode 32 and the control gate electrode 31 from the floating gate electrode 32 toward the control gate electrode 31. A blocking insulating film 44 includes the high dielectric constant layer 41, the insulating layer 42, and the high dielectric constant layer 43. The blocking insulating film 44 is a film in which a current substantially does not flow even when a voltage within the range of the drive voltage of the semiconductor memory device 1 is applied; and, for example, the dielectric constant of the entire blocking insulating film 44 is higher than the dielectric constant of silicon oxide. Also, a metal, e.g., ruthenium (Ru), may be dispersed in the high dielectric constant layer 41. In such a case, the high dielectric constant layer 41 functions also as a charge trap layer that stores charge.

The configuration of the high dielectric constant layer 41 is a C-shaped configuration surrounding the thin sheet portion 32a of the floating gate electrode 32 from three directions when viewed from the Y-direction. In other words, the high dielectric constant layer 41 is disposed on the upper surface of the thin sheet portion 32a, on the lower surface of the thin sheet portion 32a, and on the side surface of the thin sheet portion 32a on the control gate electrode 31 side. On the other hand, the high dielectric constant layer 41 is not disposed on the upper surface of the thick sheet portion 32b and on the lower surface of the thick sheet portion 32b; and the upper surface and lower surface of the thick sheet portion 32b contact an inter-layer insulating film 45 described below. In other words, a portion of the blocking insulating film 44 is disposed on the two Z-direction sides of the thin sheet portion 32a but is not disposed on the two Z-direction sides of the thick sheet portion 32b. Also, the high dielectric constant layer 41 is divided every silicon pillar 21 and floating gate electrode 32 in the Y-direction.

When viewed from the Y-direction, the configuration of the high dielectric constant layer 43 is a C-shaped configuration in the reverse direction of the high dielectric constant layer 41 and is disposed on the upper surface of the control gate electrode 31, on the lower surface of the control gate electrode 31, and on the side surface of the control gate electrode 31 on the floating gate electrode 32 side. Also, the configuration of the insulating layer 42 is similar to the high dielectric constant layer 43, is a C-shaped configuration, and is disposed on the outer surface of the high dielectric constant layer 43. The inner surface of the insulating layer 42 contacts the high dielectric constant layer 43; and a portion of the outer surface of the insulating layer 42 contacts a portion of the outer surface of the high dielectric constant layer 41. The insulating layer 42 and the high dielectric constant layer 43 extend to be continuous along the Y-direction with the control gate electrode 31.

Structure films 30 that are made of the multiple floating gate electrodes 32 and the multiple high dielectric constant layers 41 arranged along the Y-direction and are made of the insulating layer 42, the high dielectric constant layer 43, and the control gate electrode 31 extending in the Y-direction are arranged to be separated from each other along the Z-direction. Also, the inter-layer insulating film 45 that is made of, for example, silicon oxide is provided between the structure films 30 in the Z-direction. Also, an insulating member 46 that has a sheet configuration spreading along the YZ plane is provided between the structure bodies in which the structure films 30 and the inter-layer insulating films 45 are arranged alternately along the Z-direction between the pillar pairs 22 adjacent to each other along the X-direction. The insulating member 46 is formed of, for example, silicon oxide.

A tunneling insulating film 47 is provided between the floating gate electrode 32 and the silicon pillar 21 and between the inter-layer insulating film 45 and the silicon pillar 21. The tunneling insulating film 47 is a film in which a tunneling current flows when a prescribed voltage within the range of the drive voltage of the semiconductor memory device 1 is applied and is made of, for example, silicon oxide. The average dielectric constant of the entire tunneling insulating film 47 is lower than the average dielectric constant of the entire blocking insulating film 44. Also, the tunneling insulating film 47 is provided every silicon pillar 21; and the configuration of the tunneling insulating film 47 is a band configuration extending in the Z-direction. A cover layer 21a and a body layer 21b are stacked in the silicon pillar 21 in order from the tunneling insulating film 47 side.

Also, as shown in FIG. 1A and FIG. 1B, an insulating member 48 that is made of, for example, silicon oxide is provided between the two silicon pillars 21 belonging to the pillar pair 22. The insulating member 48 spreads along the YZ plane and is disposed also between the silicon pillars 21 adjacent to each other in the Y-direction, between the tunneling insulating films 47 adjacent to each other in the Y-direction, between the floating gate electrodes 32 adjacent to each other in the Y-direction, and between the high dielectric constant layers 41 adjacent to each other in the Y-direction.

Further, a source electrode 16 that has a sheet configuration spreading along the YZ plane is provided between the control gate electrodes 31 that are between the pillar pairs 22 adjacent to each other in the X-direction. The lower end of the source electrode 16 is connected to the cell source line 15. Also, the source electrode 16 and the control gate electrodes 31 are insulated from each other by the insulating member 46. The source electrode 16 is not disposed between all of the pillar pairs 22, and is disposed between the pillar pairs 22 of every several to every several tens of locations.

In the semiconductor memory device 1, a memory cell transistor that includes one floating gate electrode 32 is formed at each crossing portion between the silicon pillars 21 and the control gate electrodes 31. Also, a NAND string in which multiple memory cell transistors are connected in series is formed between the bit line 26 and the cell source line 15.

A method for manufacturing the semiconductor memory device according to the embodiment will now be described.

FIG. 3 to FIG. 15 are cross-sectional views showing the method for manufacturing the semiconductor memory device according to the embodiment.

Figure 3:
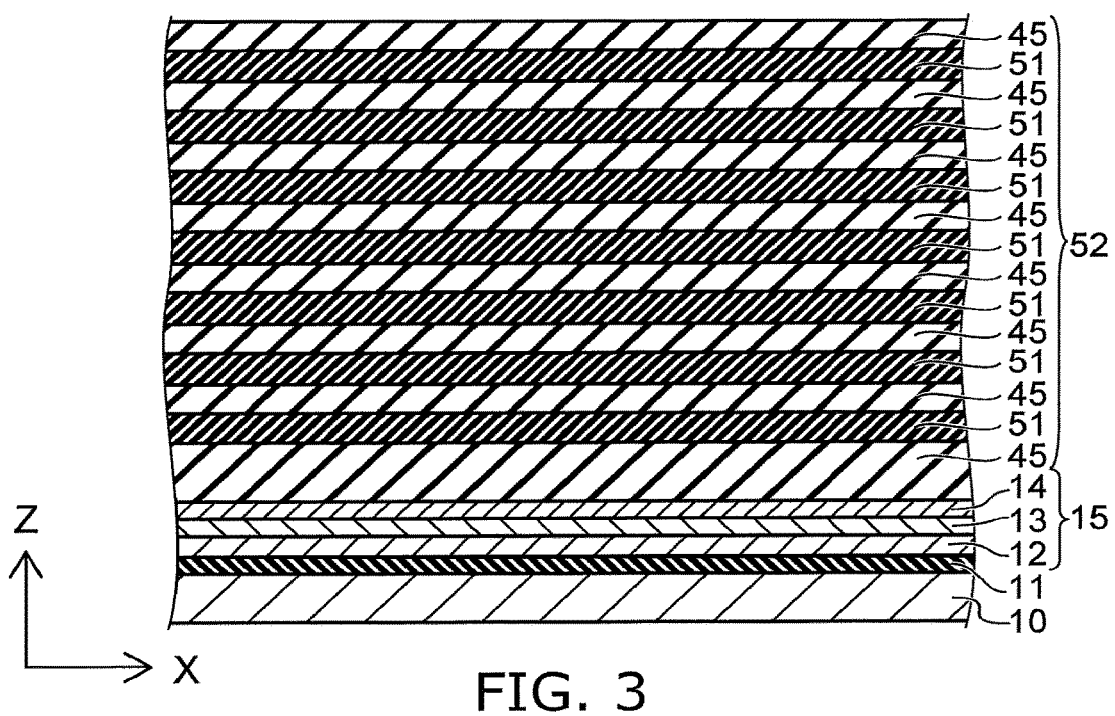
FIG. 3 to FIG. 15 are cross-sectional views showing a method for manufacturing the semiconductor memory device according to the first embodiment.

First, the silicon substrate 10 is prepared as shown in FIG. 3.

Then, the insulating film 11, the conductive layer 12, the interconnect layer 13, and the conductive layer 14 are formed in this order on the silicon substrate 10. The cell source line 15 is formed of the conductive layer 12, the interconnect layer 13, and the conductive layer 14.

Then, a stacked body 52 is formed by alternately stacking the inter-layer insulating films 45 made of, for example, silicon oxide and sacrificial films 51 made of, for example, silicon nitride on the cell source line 15.

Figure 4:
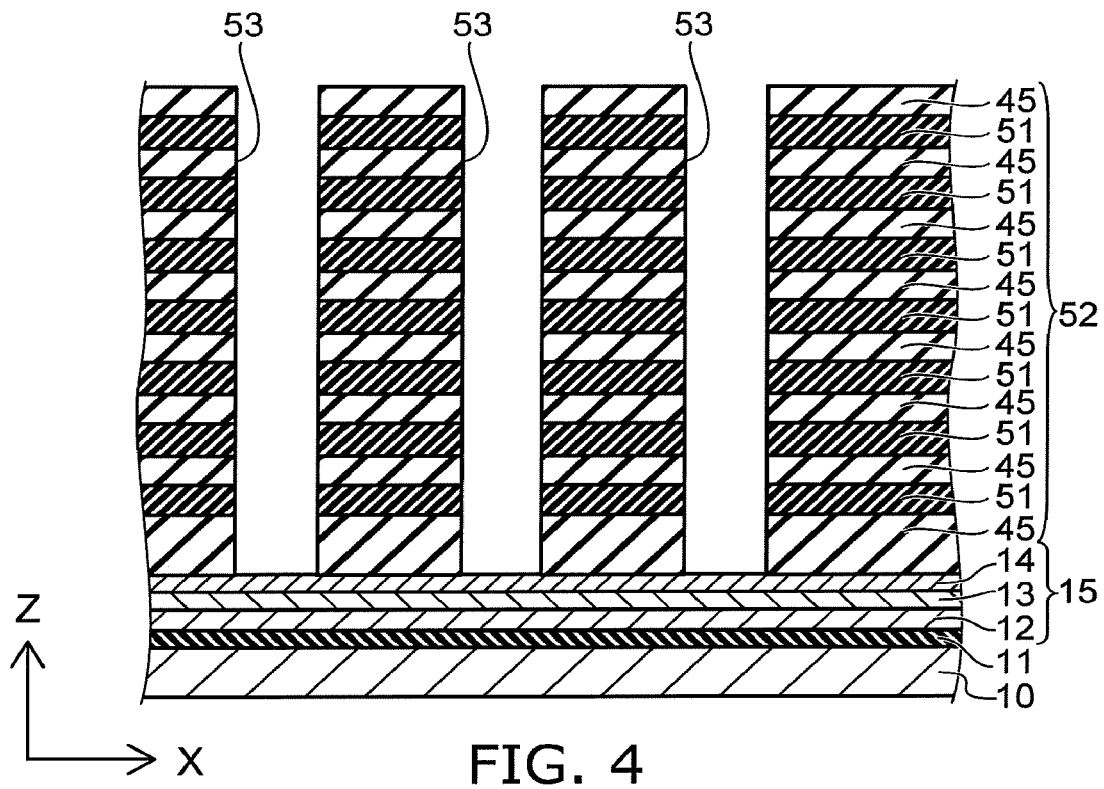

Then, as shown in FIG. 4, memory trenches 53 that extend in the Y-direction are multiply formed in the stacked body 52. The memory trenches 53 pierce the stacked body 52; and the cell source line 15 is exposed at the bottom surfaces of the memory trenches 53.

Figure 5:
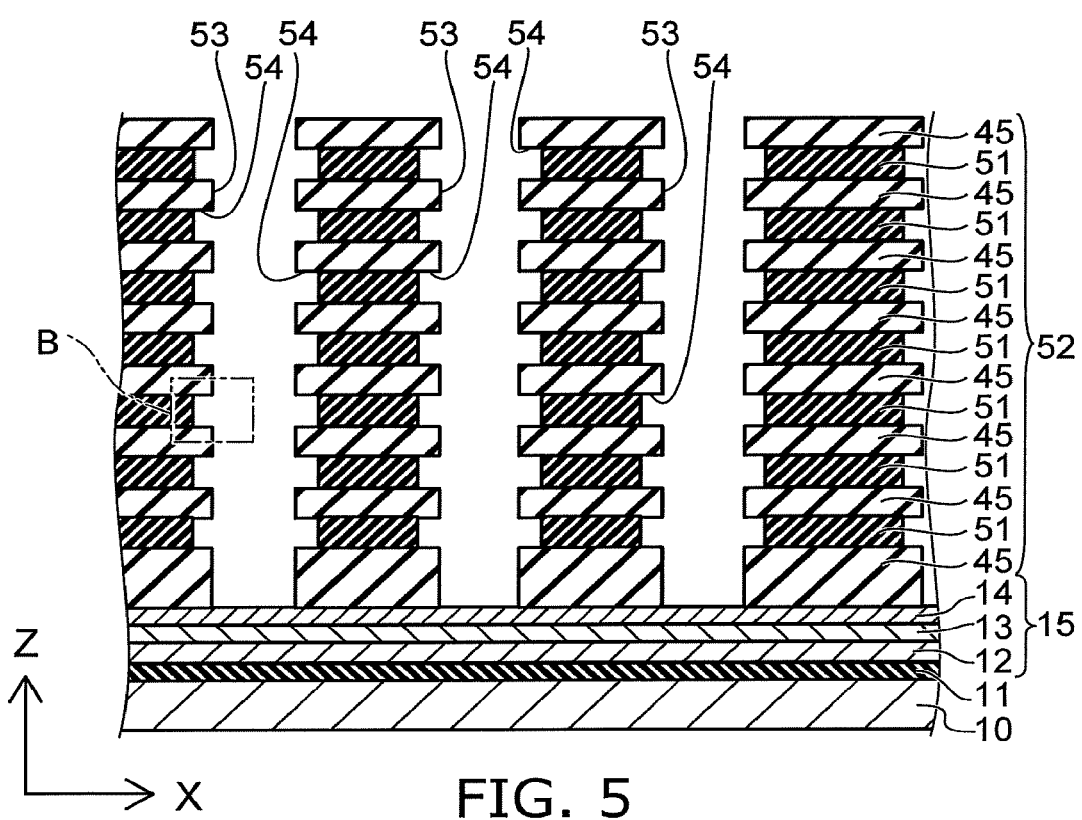

Then, as shown in FIG. 5, isotropic etching of the sacrificial films 51 is performed via the memory trenches 53. For example, wet etching using hot phosphoric acid as the etchant is performed. Thereby, a portion of the sacrificial films 51 is removed; and the exposed regions of the sacrificial films 51 recede at the side surfaces of the memory trenches 53. As a result, recesses 54 that extend in the Y-direction are formed in the side surfaces of the memory trenches 53. FIG. 6 to FIG. 11, FIG. 13, and FIG. 14 described below show a region corresponding to region B of FIG. 5.

Figure 6:
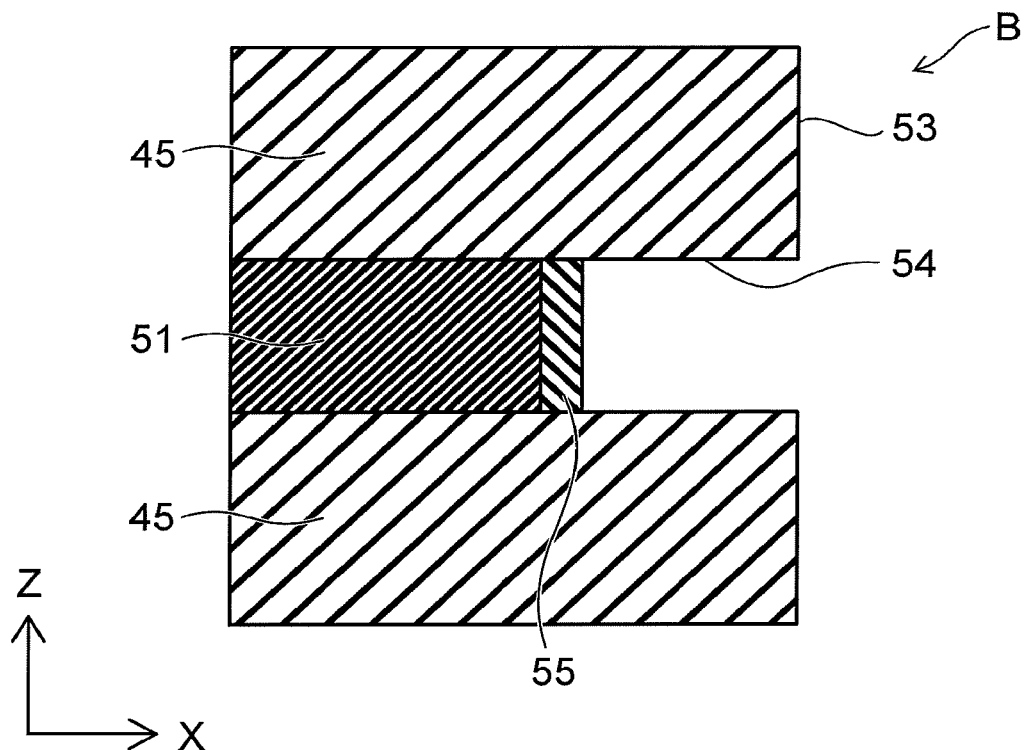

Then, as shown in FIG. 6, a cover layer 55 that is made of silicon oxide is formed on the exposed surface of the sacrificial film 51 inside the recess 54 by performing, for example, thermal oxidation treatment. The cover layer 55 may be formed by depositing silicon oxide using CVD (chemical vapor deposition), etc.

Figure 7:
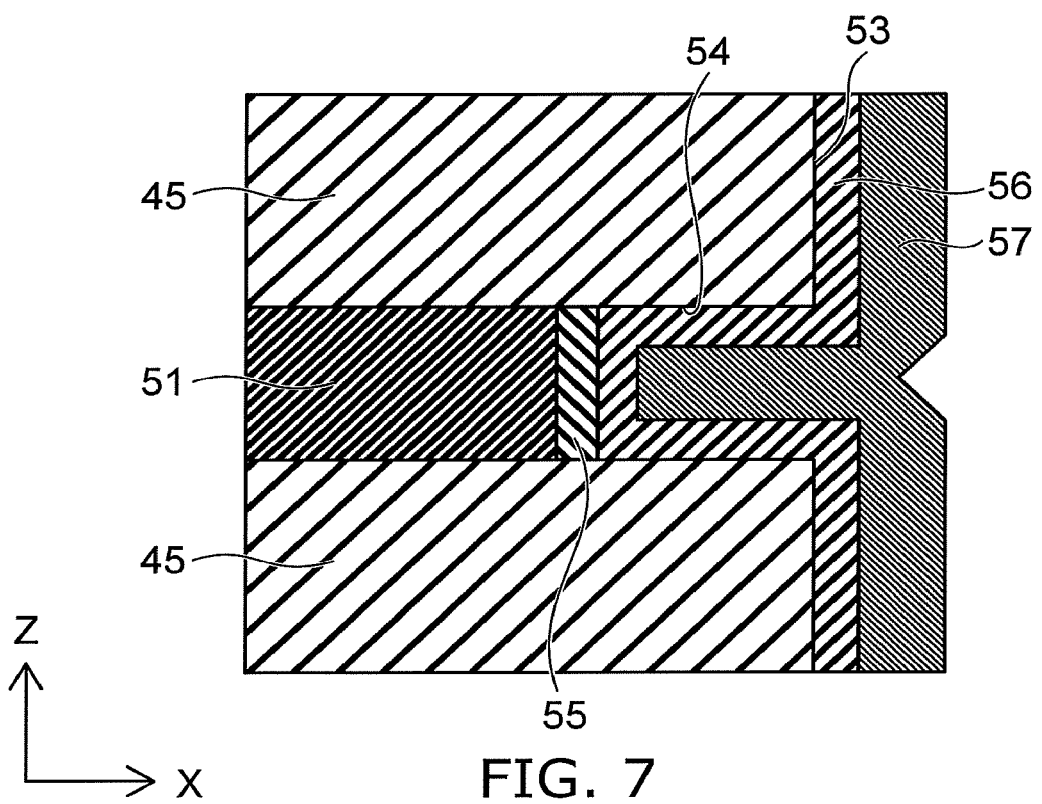

Then, as shown in FIG. 7, an HfSiO layer 56 is formed on the inner surface of the memory trench 53 by depositing hafnium silicon oxide (HfSiO) using CVD, etc. The HfSiO layer 56 is formed also on the inner surface of the recess 54. A metal such as ruthenium, etc., may be dispersed in the HfSiO layer 56. Then, a silicon film 57 is formed on the HfSiO layer 56 by depositing amorphous silicon using CVD, etc. The silicon film 57 is filled also into the recess 54.

Figure 8:
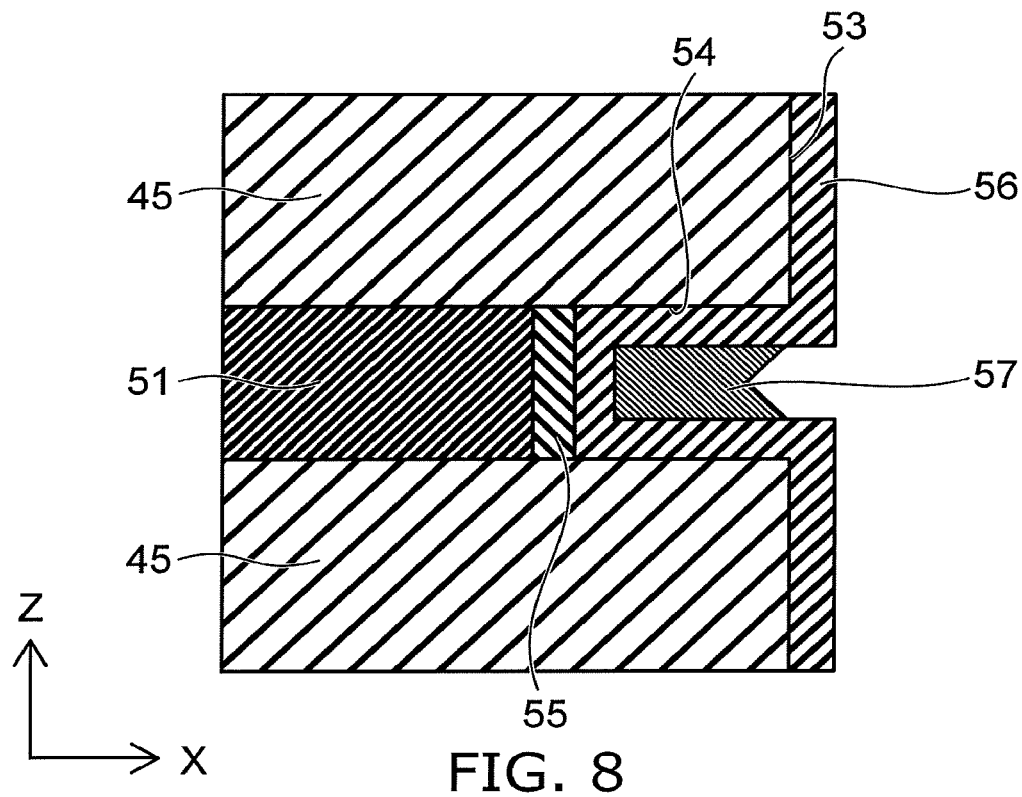

Then, as shown in FIG. 8, by recessing the silicon film 57 using, for example, RIE, the portion of the silicon film 57 disposed inside the recess 54 is caused to remain; and the portion of the silicon film 57 disposed outside the recess 54 is removed.

Figure 9:
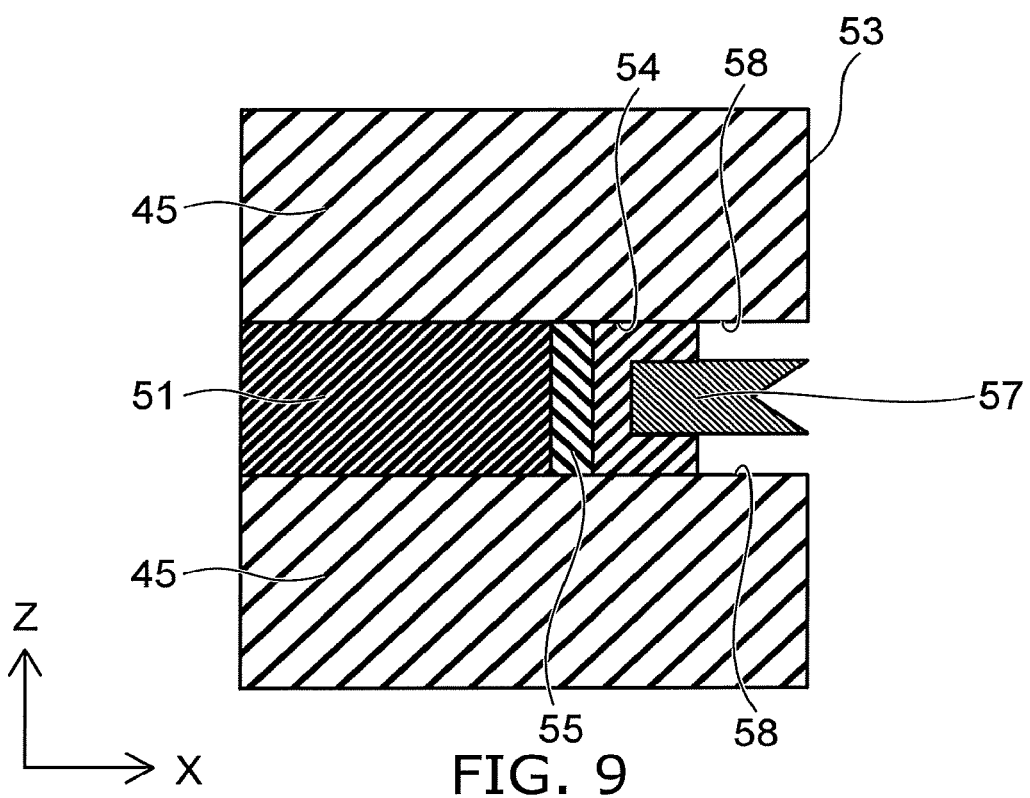

Then, as shown in FIG. 9, by recessing the HfSiO layer 56 using, for example, wet etching, the portion of the HfSiO layer 56 disposed outside the recess 54 is removed. At this time, by over-etching the HfSiO layer 56, the portion of the HfSiO layer 56 disposed on the memory trench 53 side of the recess 54 also is removed; and the portion of the HfSiO layer 56 disposed at the inner portion of the recess 54 is caused to remain. Thereby, a recess 58 is formed between the inter-layer insulating films 45 and the silicon film 57.

Figure 10:
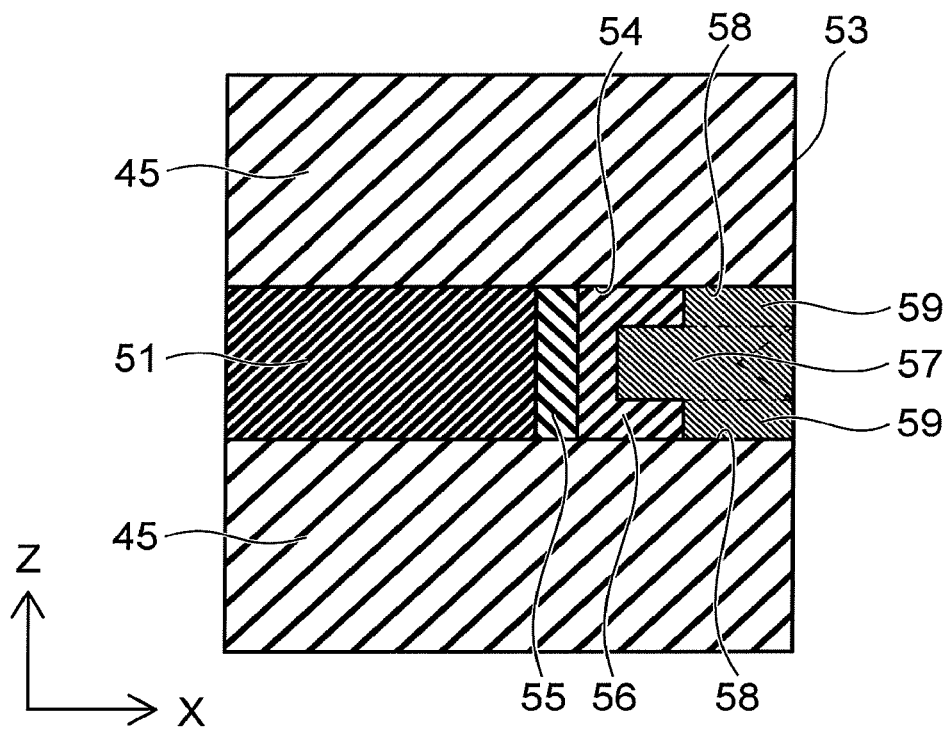

Then, as shown in FIG. 10, a silicon film 59 is formed on the inner surface of the memory trench 53 by depositing amorphous silicon using CVD, etc. The silicon film 59 is filled also into the recess 58. Then, by performing etch-back of the silicon film 59, the portion of the silicon film 59 disposed inside the recess 54 is caused to remain; and the portion of the silicon film 59 disposed outside the recess 54 is removed. At this time, the portion disposed inside the recess 58 also remains. A silicon member that has a rod configuration having a T-shaped configuration in the XZ cross section and extends in the Y-direction through the recess 54 is formed of the remaining portions of the silicon film 57 and the silicon film 59.

Figure 11:
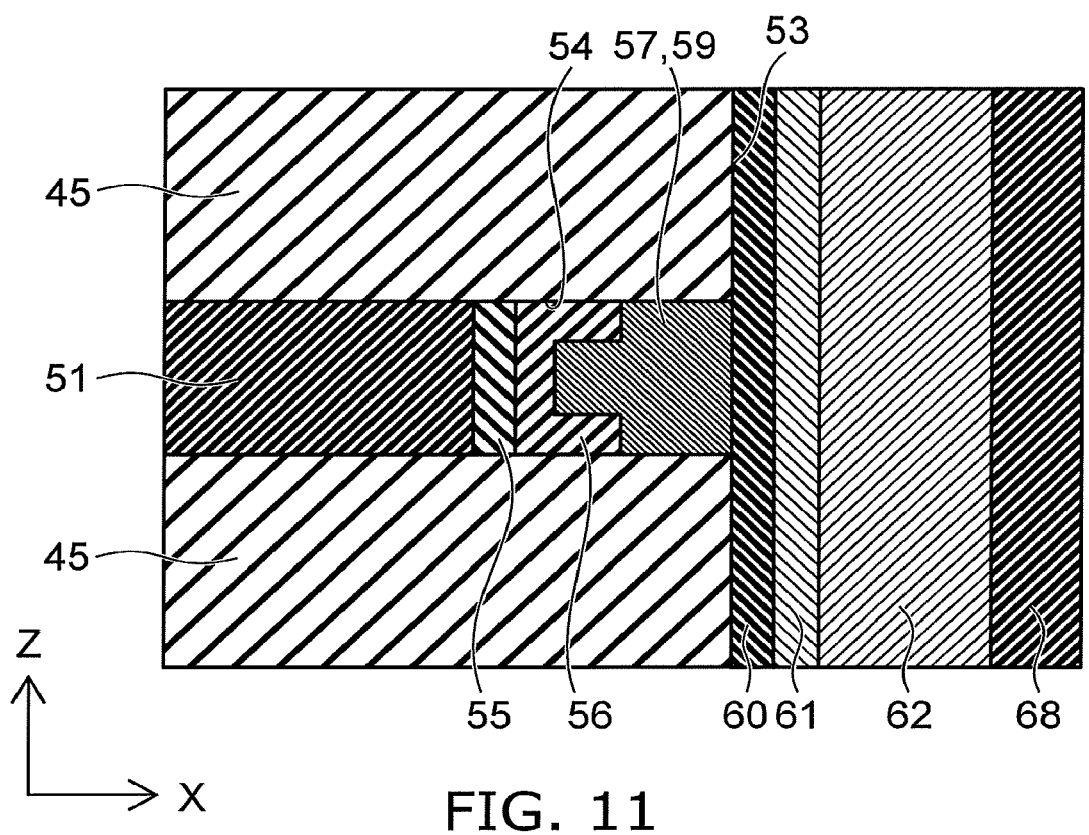

Then, as shown in FIG. 11, a silicon oxide film 60 is formed on the inner surface of the memory trench 53 by depositing silicon oxide using, for example, CVD, etc. Then, a silicon film 61 is formed on the silicon oxide film 60 by depositing amorphous silicon using CVD, etc. At this time, the silicon film 61 does not fill the entire memory trench 53.

Then, anisotropic etching such as RIE (Reactive Ion Etching) or the like of the silicon film 61 and the silicon oxide film 60 is performed. Thereby, the silicon film 61 and the silicon oxide film 60 that are on the bottom surface of the memory trench 53 are removed; and the cell source line 15 (referring to FIG. 5) is exposed. At this time, the portion of the silicon oxide film 60 disposed on the side surface of the memory trench 53 is protected by the silicon film 61 and therefore is not easily damaged by the anisotropic etching.

Then, a silicon film 62 is formed on the silicon film 61 by depositing amorphous silicon using CVD, etc. At this time, the silicon film 62 does not fill the entire memory trench 53. The silicon film 62 contacts the cell source line 15 at the bottom surface of the memory trench 53. Then, an insulating member 68 is formed inside the memory trench 53 by depositing, for example, silicon oxide.

Figure 12:
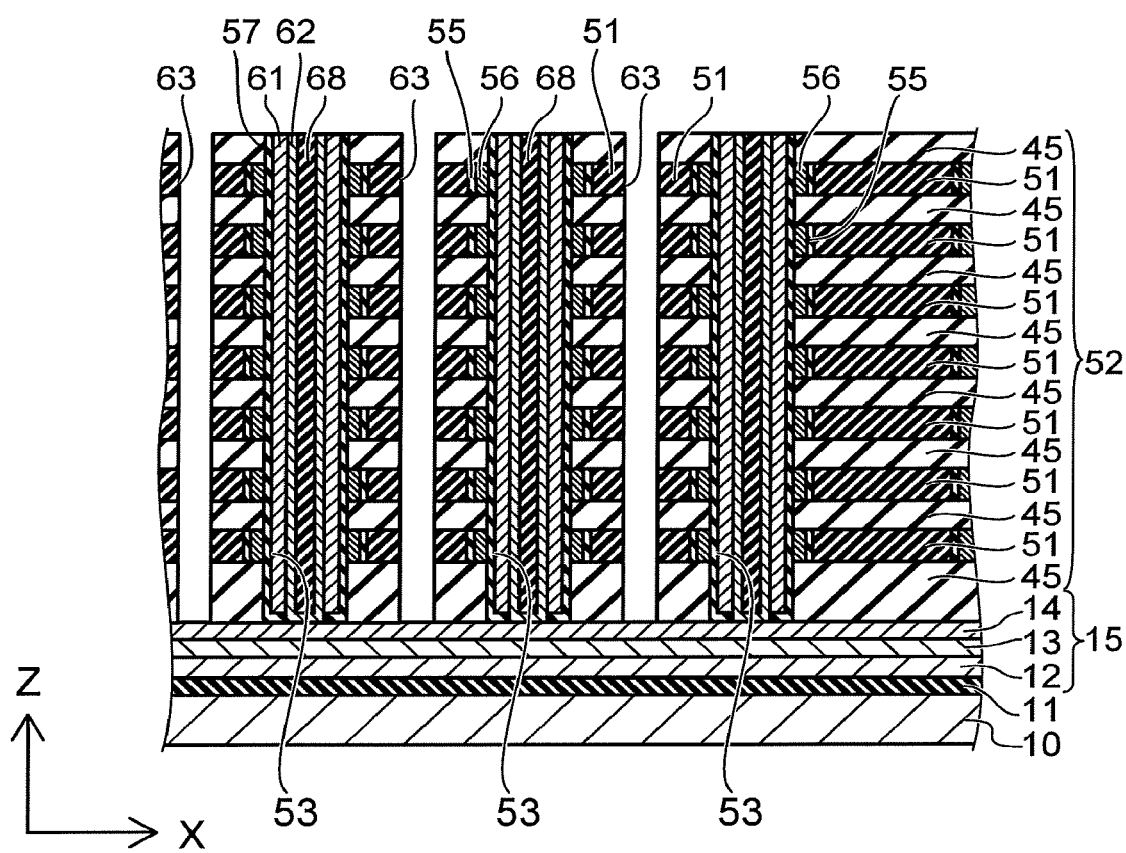

Then, as shown in FIG. 12, slits 63 that extend in the Y-direction are formed in portions of the stacked body 52 between the memory trenches 53 by performing, for example, RIE. The slits 63 pierce the stacked body 52.

Figure 13:
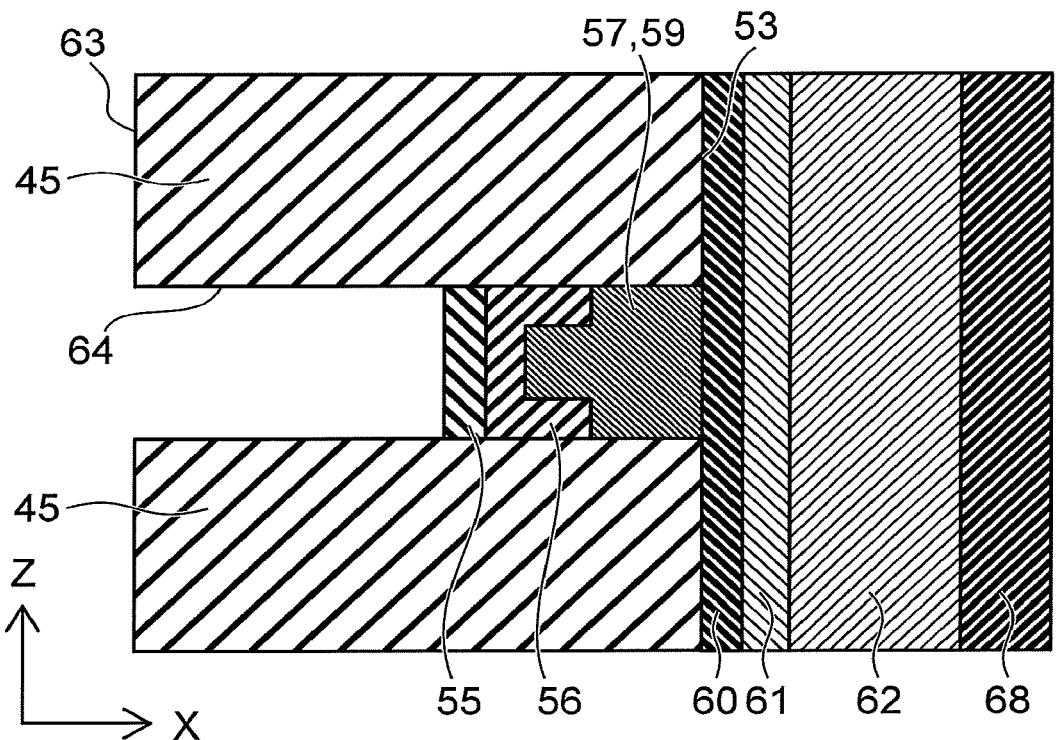

Then, as shown in FIG. 13, isotropic etching of the sacrificial film 51 is performed via the slit 63 (referring to FIG. 10) using the cover layer 55 as a stopper. For example, wet etching is performed using hot phosphoric acid as the etchant. Thereby, the sacrificial film 51 is removed; and a recess 64 that extends in the Y-direction is formed in the side surface of the slit 63. The cover layer 55 is exposed at the back surface of the recess 64.

Then, the cover layer 55 that is made of silicon oxide and is on the back surface of the recess 64 is removed via the slit 63 by performing wet etching using, for example, DHF (diluted hydrofluoric acid) as the etchant. Thereby, the HfSiO layer 56 is exposed at the back surface of the recess 64. At this time, although the exposed surfaces of the inter-layer insulating films 45 also are etched slightly, the degree of the etching can be ignored in the embodiment and is not illustrated.

Figure 14:
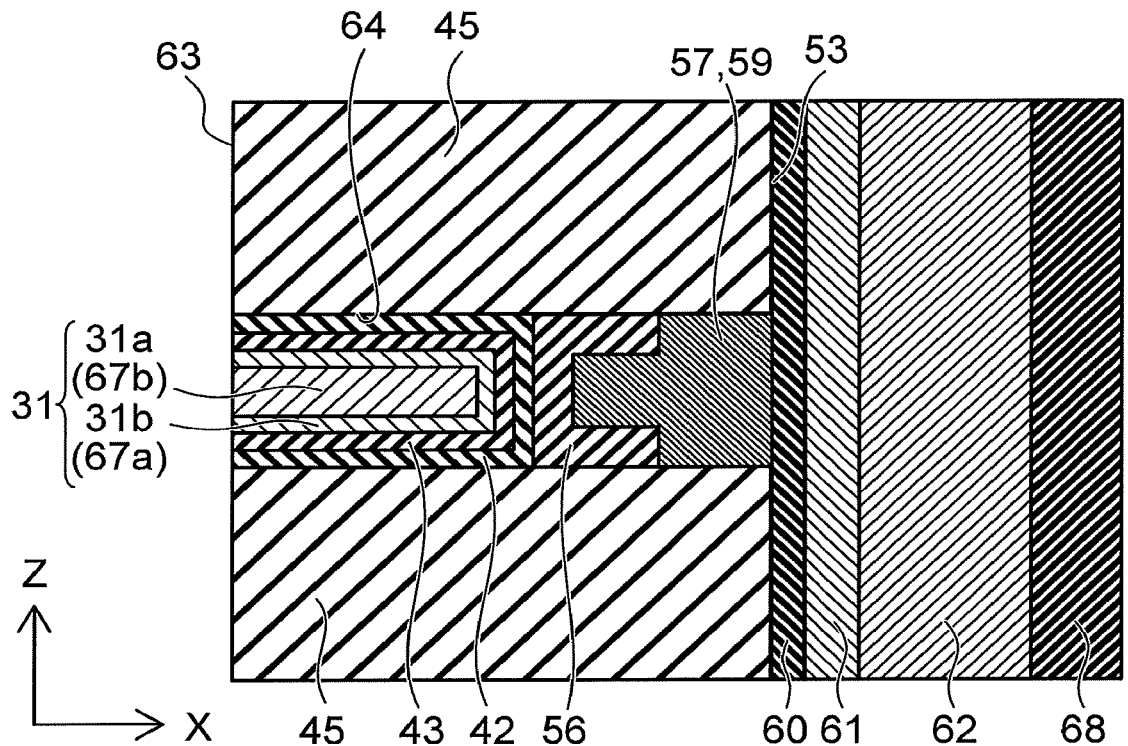

Then, as shown in FIG. 14, the insulating layer 42 is formed by depositing silicon oxide using, for example, CVD via the slit 63. The insulating layer 42 is formed on the inner surface of the recess 64 and on the inner surface of the slit 63. Then, the high dielectric constant layer 43 is formed on the side surface of the insulating layer 42 by depositing hafnium silicon oxide using, for example, CVD. At this time, the high dielectric constant layer 43 does not fill the entire interior of the recess 64.

Then, titanium nitride (TiN) is deposited using, for example, CVD inside the slit 63. Thereby, a titanium nitride layer 67a is formed on the side surface of the high dielectric constant layer 43. Then, tungsten is deposited inside the slit 63 using, for example, CVD. Thereby, a tungsten film 67b is formed on the side surface of the titanium nitride layer 67a. The tungsten film 67b fills the entire interior of the recess 64.

Then, etch-back of the tungsten film 67b and the titanium nitride layer 67a is performed via the slit 63. Thereby, the portions of the tungsten film 67b and the titanium nitride layer 67a disposed inside the recess 64 are caused to remain; and the portions of the tungsten film 67b and the titanium nitride layer 67a disposed outside the recess 64 are removed. As a result, the control gate electrode 31 is formed inside each of the recesses 64. At this time, the titanium nitride layer 67a becomes the barrier metal layer 31b; and the tungsten film 67b becomes the main portion 31a.

Then, etch-back of the high dielectric constant layer 43 and the insulating layer 42 is performed via the slit 63. Thereby, the portions of the high dielectric constant layer 43 and the insulating layer 42 disposed inside the recess 64 are caused to remain; and the portions of the high dielectric constant layer 43 and the insulating layer 42 disposed outside the recess 64 are removed. Thereby, the high dielectric constant layer 43 and the insulating layer 42 are divided every recess 64. Then, the insulating member 46 (referring to FIG. 2) is formed inside the slit 63 by depositing silicon oxide.

Figure 15:
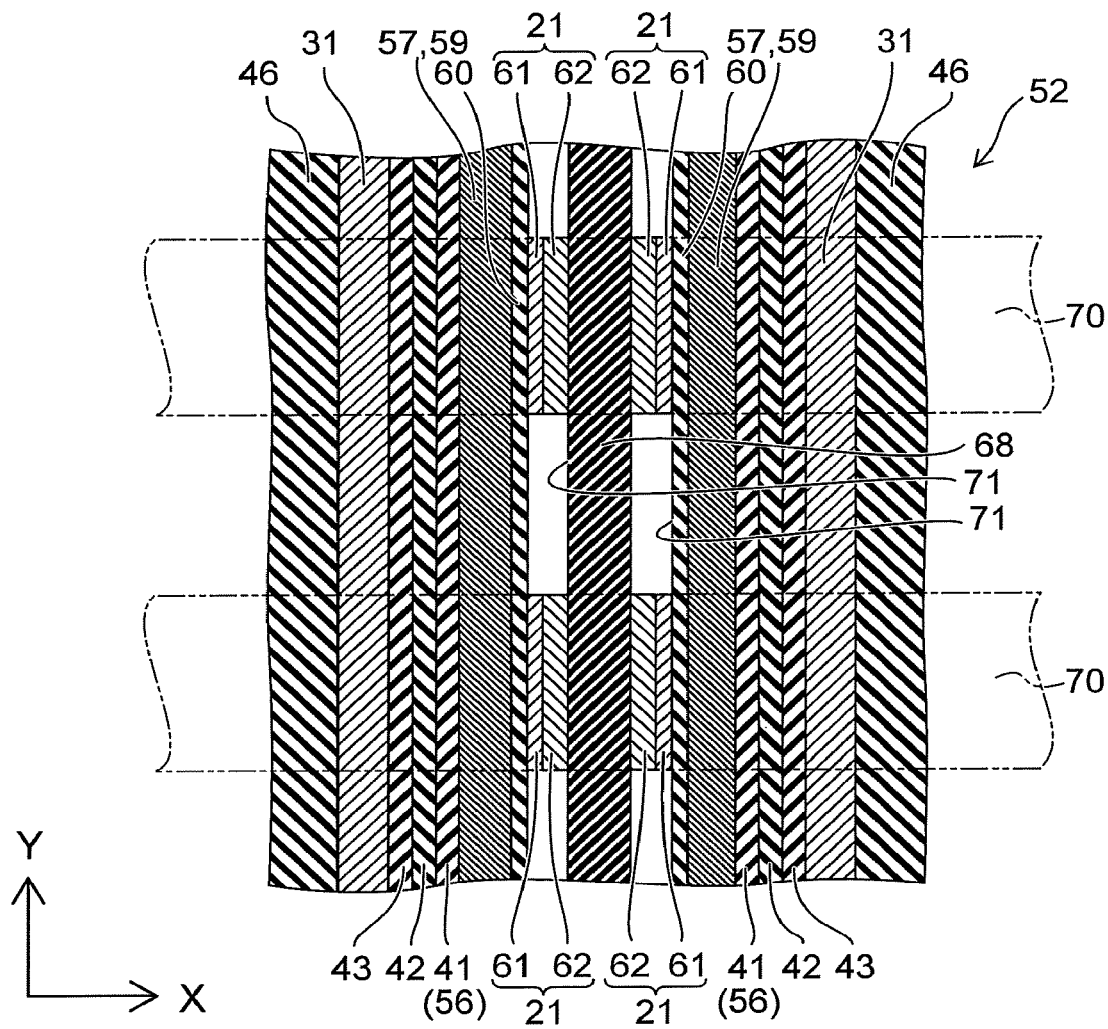

Then, as shown in FIG. 15, a mask pattern 70, in which lines-and-spaces extend in the X-direction and are repeated along the Y-direction, is formed on the stacked body 52. FIG. 15 is an XY cross-sectional view. Also, the mask pattern 70 is illustrated by double dot-dash lines in FIG. 15.

Then, anisotropic etching such as RIE or the like is performed using the mask pattern 70 as a mask at conditions such that silicon can be etched selectively. Thereby, the silicon pillars 21 are formed by the silicon film 61 and the silicon film 62 being divided along the Y-direction. At this time, the silicon film 61 becomes the cover layer 21a (referring to FIG. 2); and the silicon film 62 becomes the body layer 21b (referring to FIG. 2). The lower end portions of the two silicon pillars 21 adjacent to each other in the X-direction are connected to each other because the portion of the silicon film 62 disposed in the region directly under the insulating member 68 is not removed. Also, the region where the silicon film 61 and the silicon film 62 are removed becomes a space 71.

Then, isotropic etching such as wet etching or the like is performed via the space 71. Thereby, the silicon oxide film 60, the silicon films 59 and 57, and the HfSiO layer 56 are selectively removed and divided along the Y-direction. The silicon oxide film 60 becomes the tunneling insulating films 47 (referring to FIG. 2) by being divided along the Y-direction. The silicon films 59 and 57 become the floating gate electrodes 32 (referring to FIG. 2) by being divided along the Y-direction. The HfSiO layer 56 becomes the high dielectric constant layers 41 by being divided along the Y-direction. Then, the mask pattern 70 is removed. Then, the insulating member 48 (referring to FIG. 2) is formed inside the memory trench 53 by depositing silicon oxide. At this time, the insulating member 68 becomes a portion of the insulating member 48.

Then, as shown in FIG. 1A and FIG. 1B, a slit that extends in the Y-direction and reaches the cell source line 15 is formed inside a portion of the insulating member 46. Then, the source electrode 16 is formed inside the slit by filling a conductive material such as, for example, tungsten, etc. Also, the connection member 24 is formed on the pillar pair 22 and connected to the pillar pair 22. Then, the connection member 24 is buried in an inter-layer insulating film 49. Then, the plug is formed inside the inter-layer insulating film 49 and connected to the connection member 24. Then, the bit line 26 is formed on the inter-layer insulating film 49 and connected to the plug 25. Thus, the semiconductor memory device 1 according to the embodiment is manufactured.

Effects of the embodiment will now be described.

In the semiconductor memory device 1 according to the embodiment as shown in FIG. 2, the thick sheet portion 32b is provided in the floating gate electrode 32 by removing a portion of the high dielectric constant layer 41; and the thick sheet portion 32b opposes the silicon pillar 21 with the tunneling insulating film 47 interposed. Thereby, a gate length L of the memory cell transistor formed at this portion can be lengthened. Also, by providing the thick sheet portion 32b, the volume of the floating gate electrode 32 can be increased without increasing the distance between the inter-layer insulating films 45 in the Z-direction. Thereby, the amount of charge that can be stored in the floating gate electrode 32 increases. The reliability of the semiconductor memory device 1 can be increased by these effects.

Second Embodiment

A second embodiment will now be described.

Figure 16:
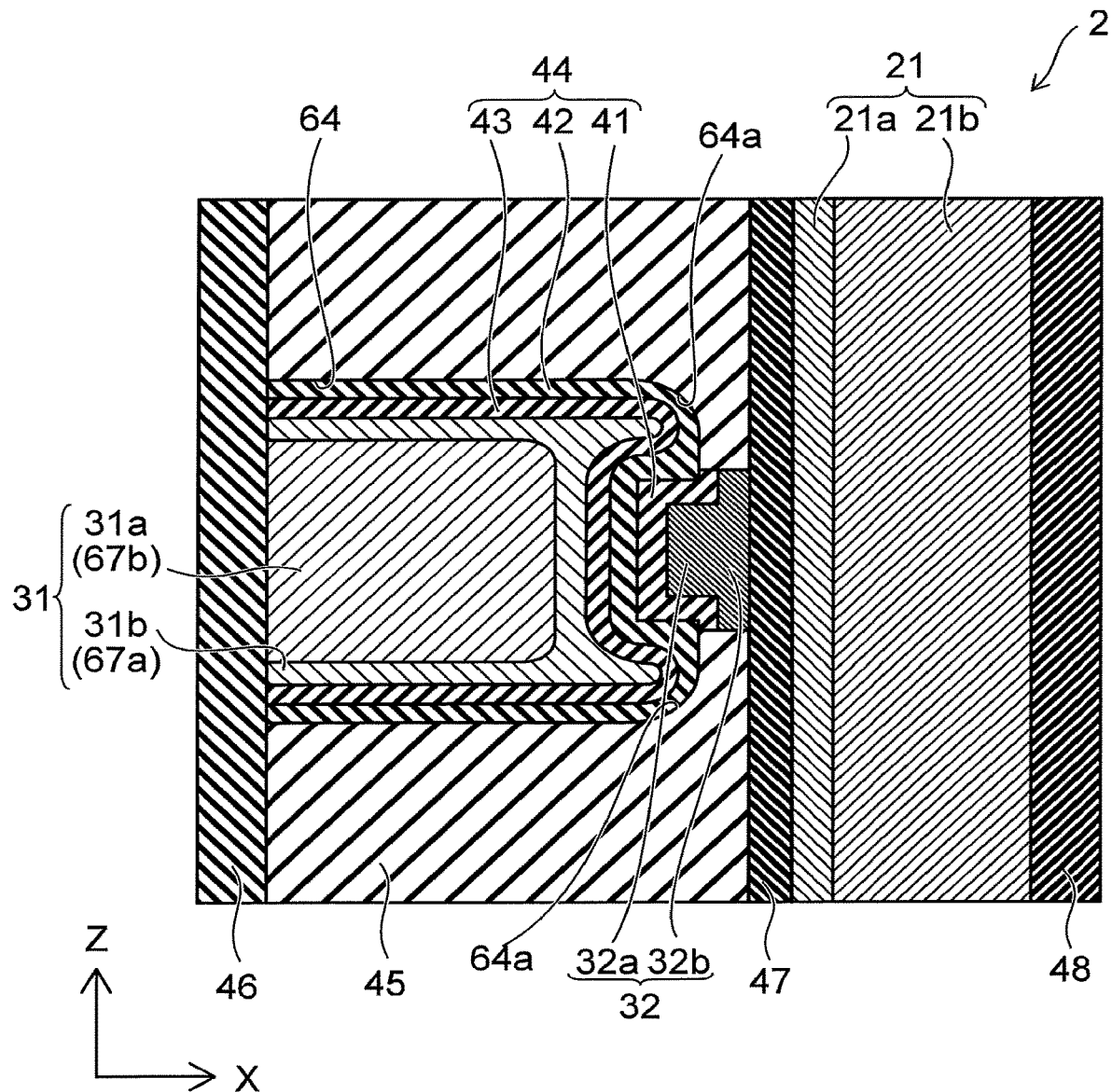
FIG. 16 is a cross-sectional view showing a semiconductor memory device according to a second embodiment.

FIG. 16 is a cross-sectional view showing a semiconductor memory device according to the embodiment.

FIG. 16 shows a region corresponding to region A of FIG. 1A.

In the semiconductor memory device 2 according to the embodiment as shown in FIG. 16, the length of the recess 64 in the Z-direction is longer than the length of the floating gate electrode 32 in the Z-direction. Also, an inner portion 64a of the recess 64 extends above and below the floating gate electrode 32 and the high dielectric constant layer 41. Also, portions of the insulating layer 42, the high dielectric constant layer 43, and the barrier metal layer 31b enter the interior of the inner portion 64a of the recess 64. Therefore, the insulating layer 42, the high dielectric constant layer 43, and the barrier metal layer 31b are the disposed also above and below the high dielectric constant layer 41 and the thin sheet portion 32a of the floating gate electrode 32. Thereby, the blocking insulating film 44 and the control gate electrode 31 surround the corners of the floating gate electrode 32 on the control gate electrode 31 side.

A method for manufacturing the semiconductor memory device according to the embodiment will now be described.

Figure 17:
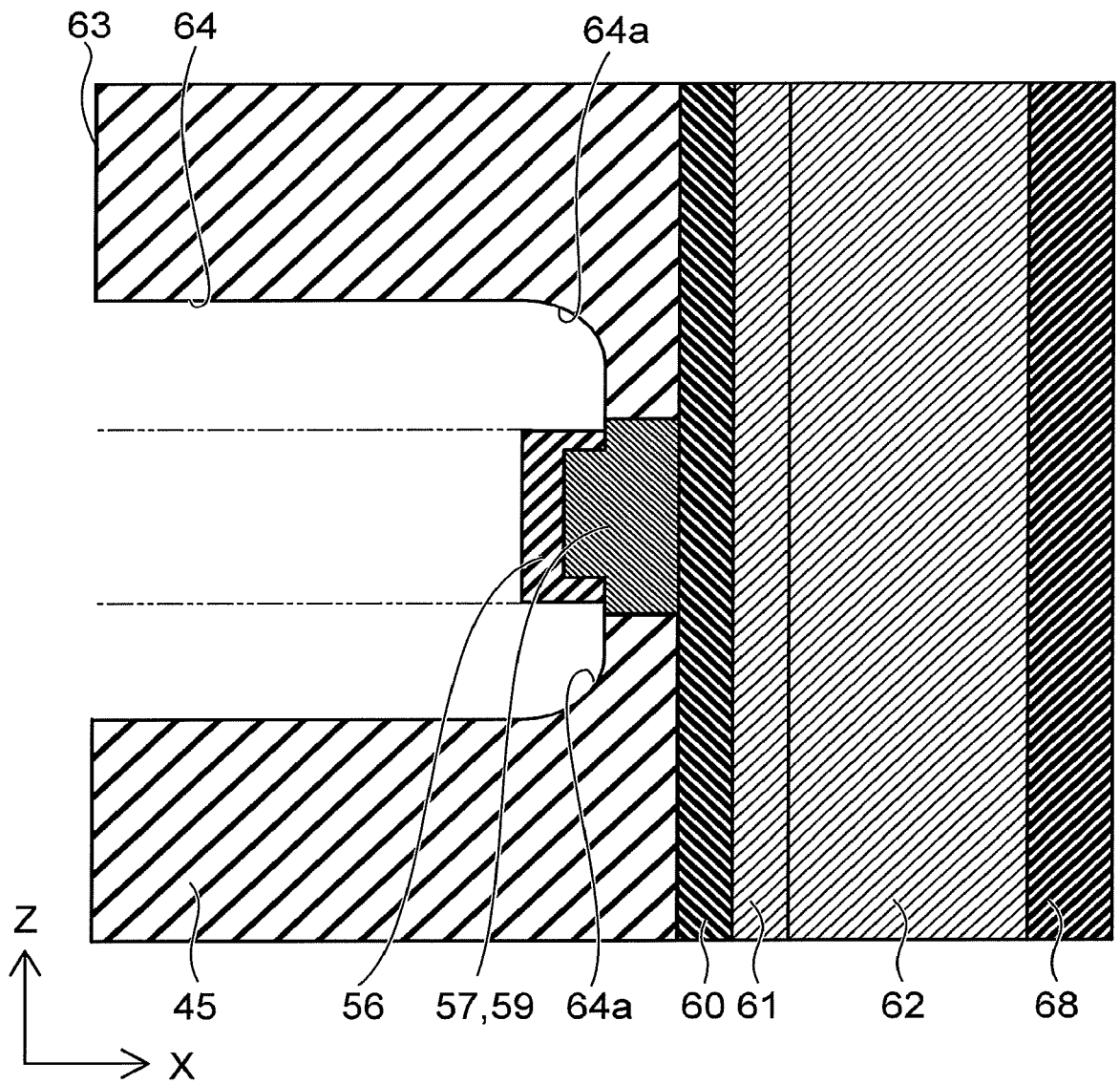
FIG. 17 is a cross-sectional view showing a method for manufacturing the semiconductor memory device according to the second embodiment.

FIG. 17 is a cross-sectional view showing the method for manufacturing the semiconductor memory device according to the embodiment.

First, the intermediate structure body shown in FIG. 13 is made by implementing the processes shown in FIG. 3 to FIG. 13.

Then, as shown in FIG. 17, the inter-layer insulating films 45 are etched together with the cover layer 55 via the recess 64 by performing, for example, wet etching using DHF as the etchant. Thereby, the length in the Z-direction of the recess 64 lengthens; and the back surface of the recess 64 recedes to detour around the HfSiO layer 56 and is enlarged to the two Z-direction sides of the HfSiO layer 56. As a result, the inner portion 64a is formed on and under the HfSiO layer 56. The HfSiO layer 56 is a layer that becomes the high dielectric constant layer 41 by being patterned in a subsequent process.

Then, as shown in FIG. 16, the insulating layer 42, the high dielectric constant layer 43, the titanium nitride layer 67a (the barrier metal layer 31b), and the tungsten film 67b (the main portion 31a) are formed in this order on the inner surface of the recess 64. At this time, the insulating layer 42, the high dielectric constant layer 43, and the titanium nitride layer 67a enter the inner portion 64a. Thereafter, the manufacturing method is similar to that of the first embodiment described above.

Effects of the embodiment will now be described.

According to the embodiment, the concentration of the electric field at the corners of the floating gate electrode 32 can be relaxed because the blocking insulating film 44 is disposed to surround the corners of the floating gate electrode 32 on the control gate electrode 31 side.

Also, in the embodiment, the controllability of the floating gate electrode 32 by the control gate electrode 31 can be increased because a portion of the control gate electrode 31 is disposed also above and below the floating gate electrode 32.

Further, according to the embodiment, the control gate electrode 31 can be formed to be thick because the recess 64 is enlarged in the process shown in FIG. 17. Thereby, the interconnect resistance of the control gate electrode 31 can be reduced; and the reliability and operation speed of the semiconductor memory device 2 can be increased.

Otherwise, the configuration, the manufacturing method, the operations, and the effects of the embodiment are similar to those of the first embodiment described above.

Third Embodiment

A third embodiment will now be described.

Figure 18:
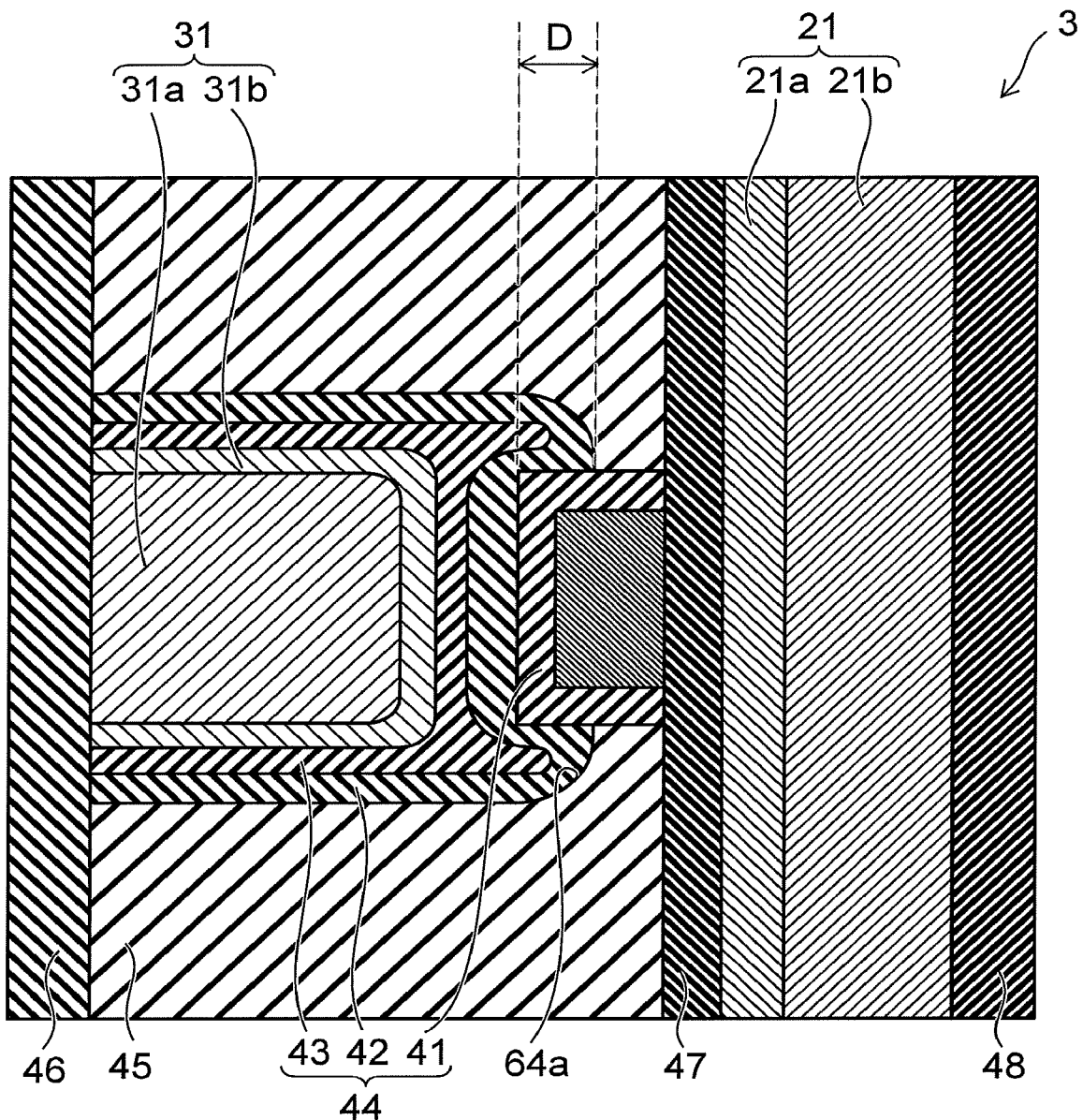
FIG. 18 is a cross-sectional view showing a semiconductor memory device according to a third embodiment.

FIG. 18 is a cross-sectional view showing a semiconductor memory device according to the embodiment.

FIG. 18 shows a region corresponding to region A of FIG. 1A.

As shown in FIG. 18, the semiconductor memory device 3 according to the embodiment differs from the semiconductor memory device 2 according to the second embodiment described above (referring to FIG. 16) in that the configuration of the floating gate electrode 32 when viewed from the Y-direction is a rectangle instead of T-shaped; and the barrier metal layer 31b does not enter the inner portion 64a of the recess 64. Also, in the semiconductor memory device 3, a depth D of the inner portion 64a, i.e., the distance between the surface of the HfSiO layer 56 on the slit 63 side and the deepest portion of the inner portion 64a, is shorter than that of the semiconductor memory device 2 according to the second embodiment (referring to FIG. 16).

A method for manufacturing the semiconductor memory device according to the embodiment will now be described.

Figure 19:
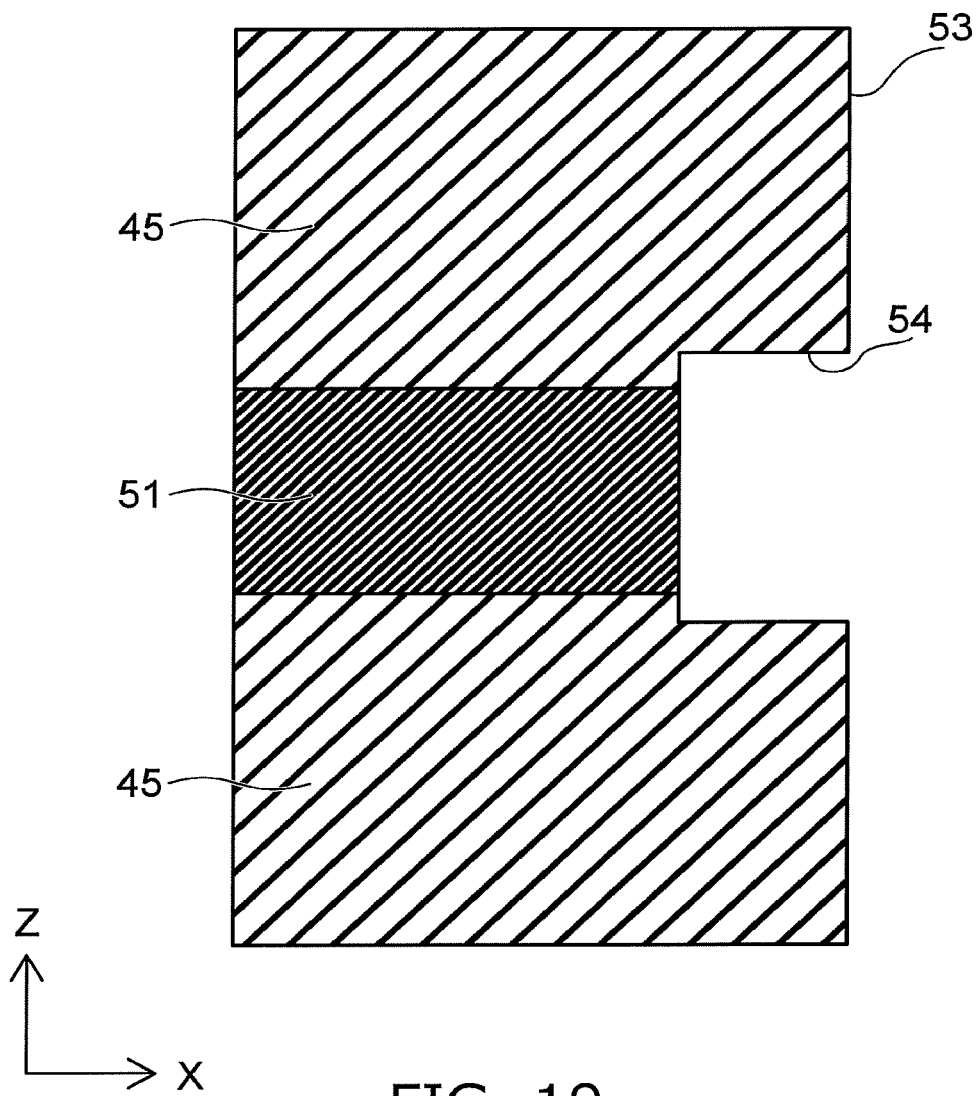
FIG. 19 to FIG. 21 are cross-sectional views showing a method for manufacturing the semiconductor memory device according to the third embodiment.
Figure 20:
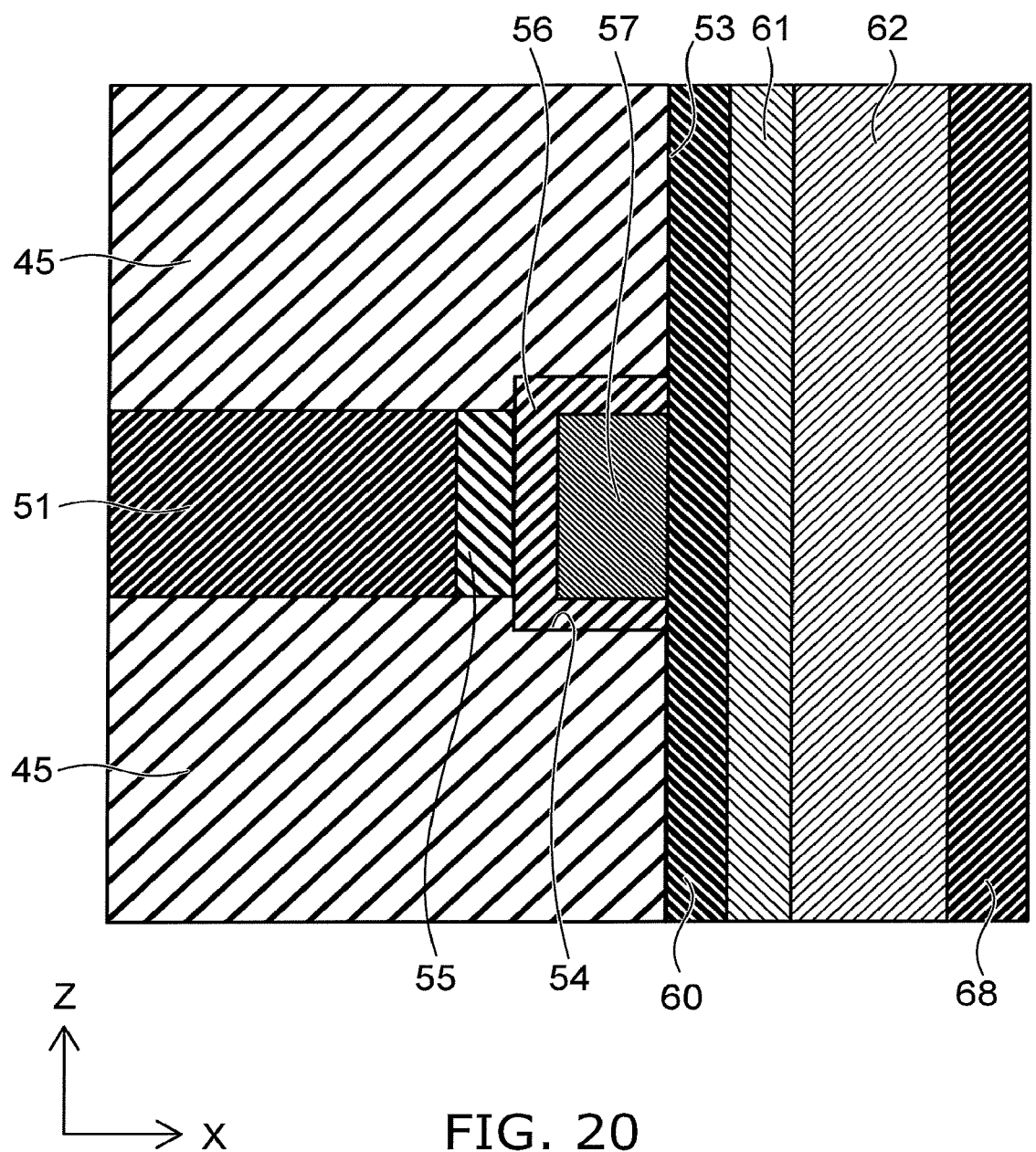
Figure 21:
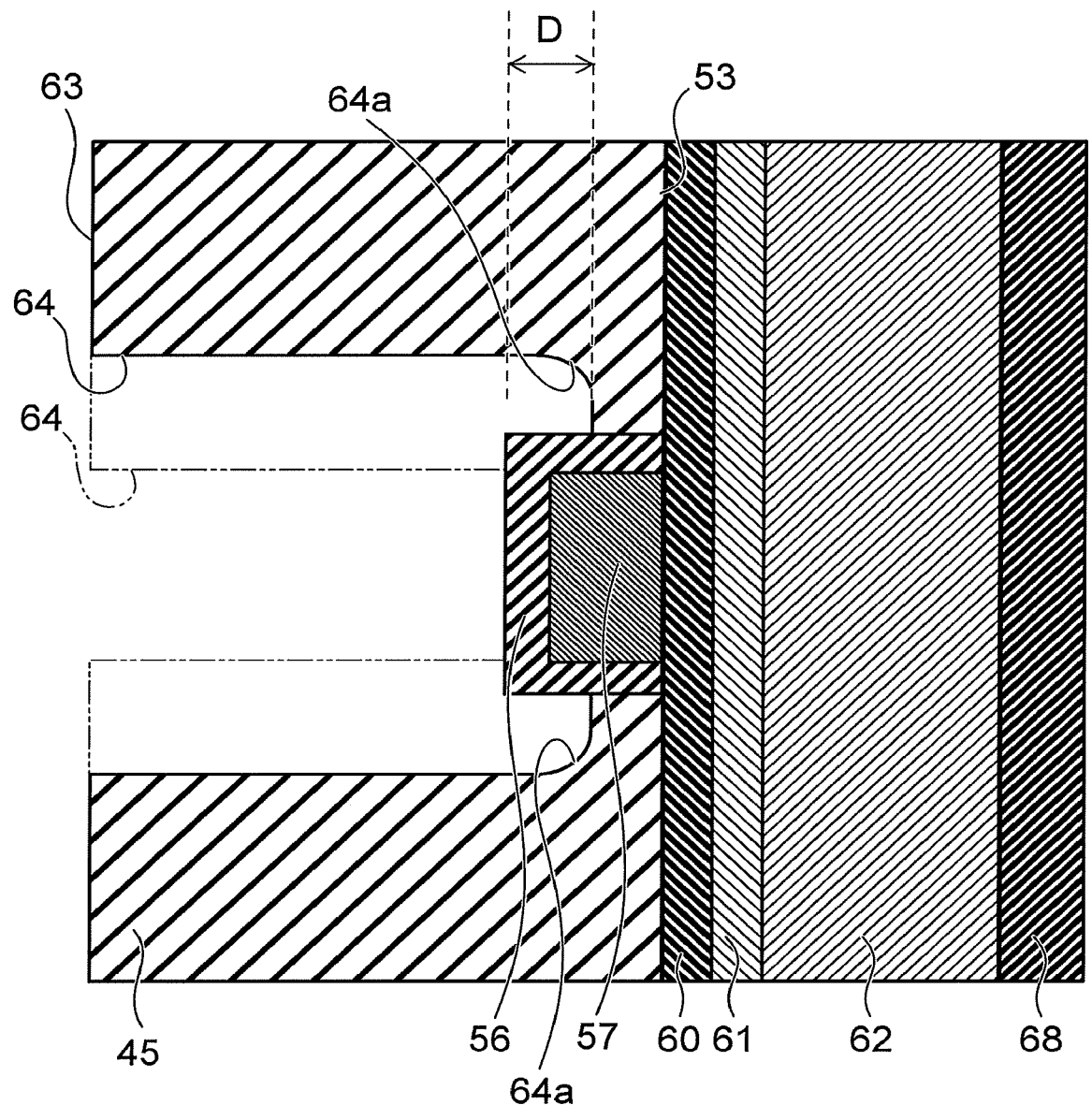

FIG. 19 to FIG. 21 are cross-sectional views showing the method for manufacturing the semiconductor memory device according to the embodiment.

First, the intermediate structure body shown in FIG. 6 is made by implementing the processes shown in FIG. 3 to FIG. 6.

Then, as shown in FIG. 19, the recess 54 is enlarged in the Z-direction by etching the inter-layer insulating films 45 made of silicon oxide via the recess 54 by performing wet etching. At this time, the sacrificial film 51 that is made of silicon nitride substantially is not etched.

Then, as shown in FIG. 20, the cover layer 55 is formed by oxidizing the exposed portion of the sacrificial film 51. Then, the HfSiO layer 56 and the silicon film 57 are formed and recessed to cause the HfSiO layer 56 and the silicon film 57 to remain only inside the recess 54. At this time, over-etching of the HfSiO layer 56 is not performed. Then, by a method similar to that of the first embodiment described above, the silicon oxide film 60, the silicon film 61, and the silicon film 62 are formed on the inner surface of the memory trench 53; and the interior of the memory trench 53 is filled with the insulating member 68.

Then, the processes shown in FIG. 12 and FIG. 13 are implemented. Namely, the slits 63 are formed in the stacked body 52; the recesses 64 are formed by removing the sacrificial films 51 via the slits 63; and the cover layer 55 is removed via the recesses 64.

Then, as shown in FIG. 21, wet etching of the inter-layer insulating films 45 is performed via the slit 63. Thereby, the recess 64 is enlarged in the Z-direction; the back surface is recessed; and the inner portion 64a is formed on and under the HfSiO layer 56. At this time, the depth D of the inner portion 64a is caused to be shorter than that of the second embodiment described above (referring to FIG. 17).

Then, as shown in FIG. 18, the insulating layer 42, the high dielectric constant layer 43, the titanium nitride layer 67a (the barrier metal layer 31b), and the tungsten film 67b (the main portion 31a) are formed in this order on the inner surface of the recess 64. At this time, the insulating layer 42 and the high dielectric constant layer 43 enter the inner portion 64a; but the titanium nitride layer 67a does not enter the inner portion 64a. Thereafter, the manufacturing method is similar to that of the first embodiment described above.

Effects of the embodiment will now be described.

According to the embodiment, the concentration of the electric field can be relaxed because the blocking insulating film 44 is disposed to surround the corners of the floating gate electrode 32.

Also, because the recess 54 is enlarged in the process shown in FIG. 19 according to the embodiment, the length in the Z-direction of the floating gate electrode 32 can be lengthened and the volume can be increased without forming the thick sheet portion 32b in the floating gate electrode 32 by over-etching of the HfSiO layer 56 as in the first embodiment described above. Thereby, the reliability of the semiconductor memory device 3 can be increased without implementing the process of depositing the silicon film 59 shown in FIG. 10.

Otherwise, the configuration, the manufacturing method, the operations, and the effects of the embodiment are similar to those of the first embodiment described above.

Fourth Embodiment

A fourth embodiment will now be described.

Figure 22:
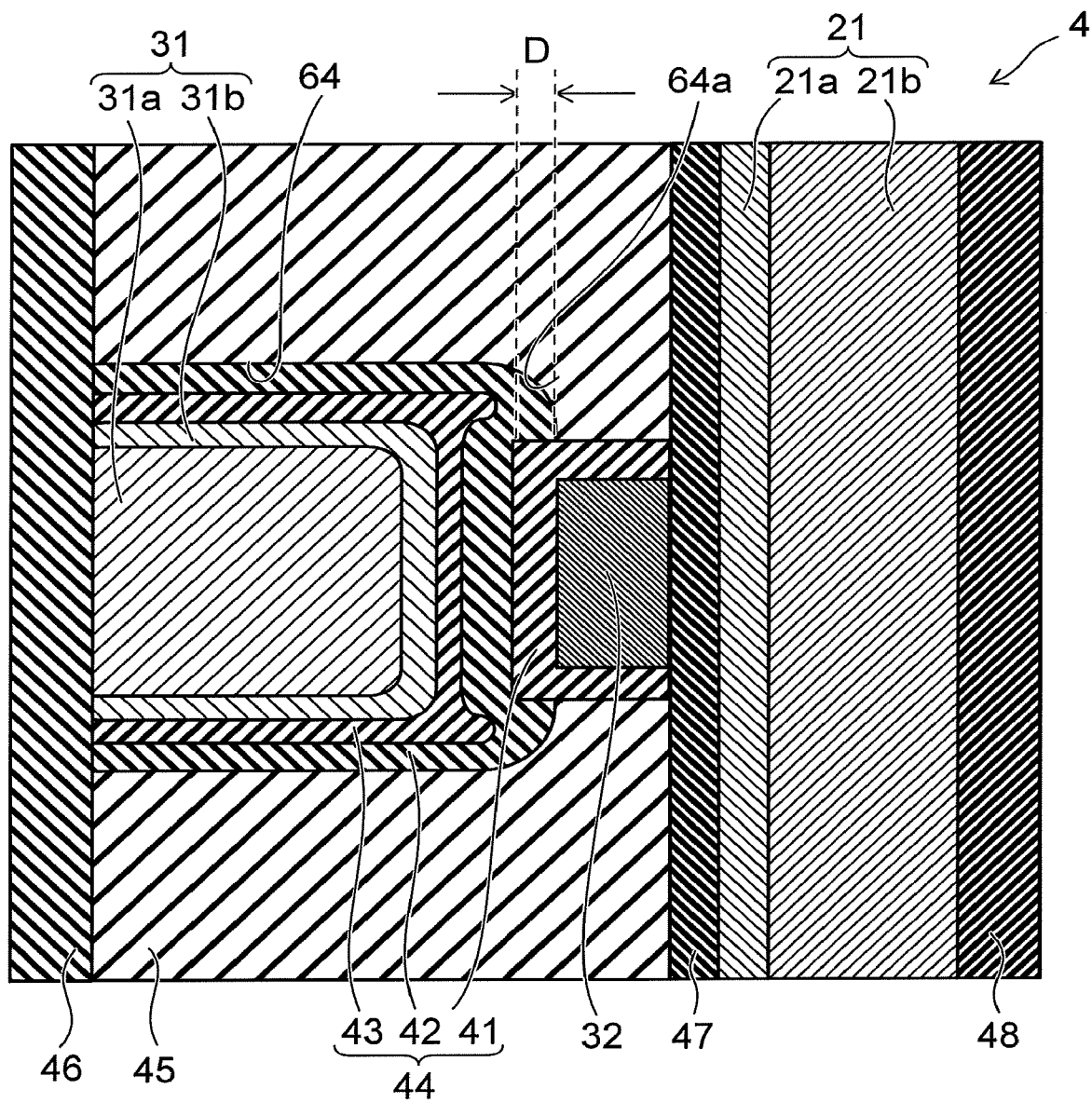
FIG. 22 is a cross-sectional view showing a semiconductor memory device according to a fourth embodiment.

FIG. 22 is a cross-sectional view showing a semiconductor memory device according to the embodiment.

FIG. 22 shows a region corresponding to region A of FIG. 1A.

As shown in FIG. 22, the semiconductor memory device 4 according to the embodiment differs from the semiconductor memory device 3 according to the third embodiment described above (referring to FIG. 18) in that the depth D of the inner portion 64a is short. Therefore, only the insulating layer 42 is disposed inside the inner portion 64a; and the high dielectric constant layer 43 and the control gate electrode 31 are disposed outside the inner portion 64a.

A method for manufacturing the semiconductor memory device according to the embodiment will now be described.

Figure 23:
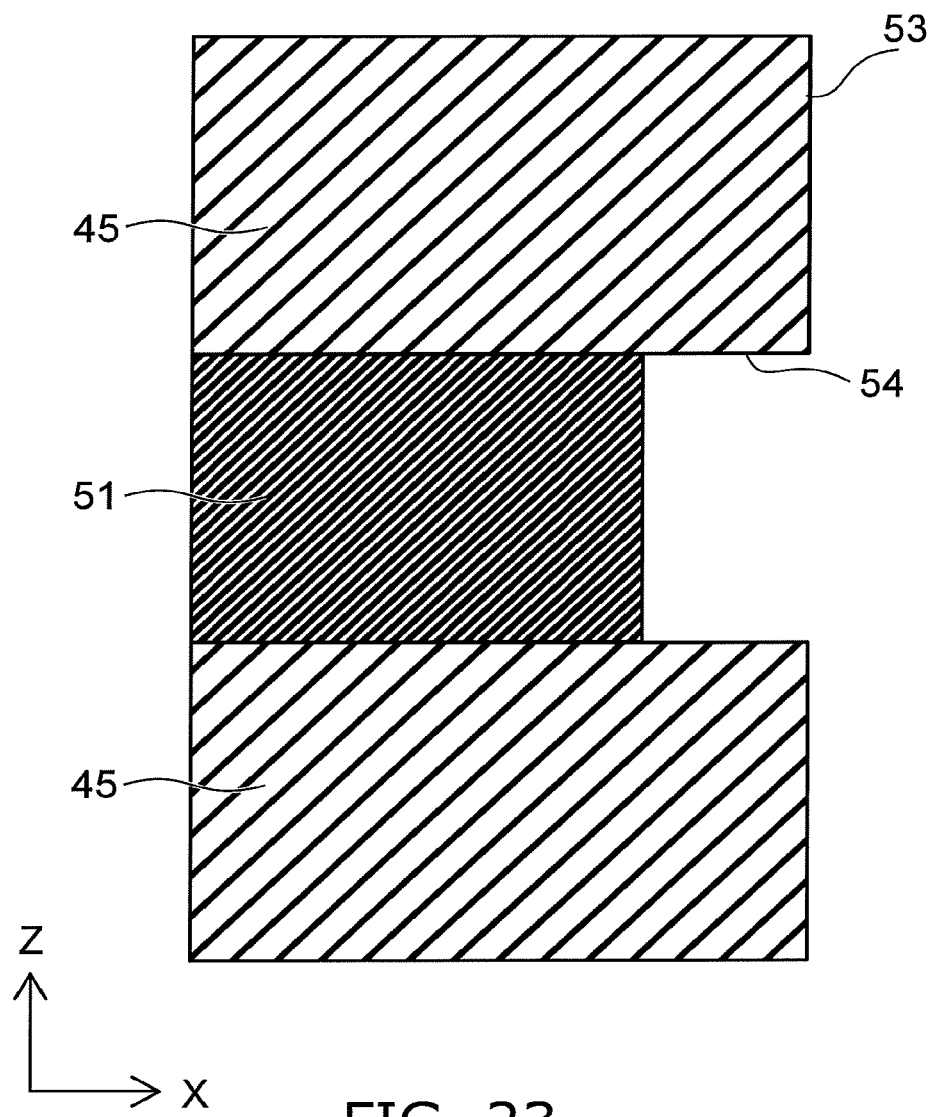
FIG. 23 to FIG. 25 are cross-sectional views showing a method for manufacturing the semiconductor memory device according to the fourth embodiment.
Figure 24:
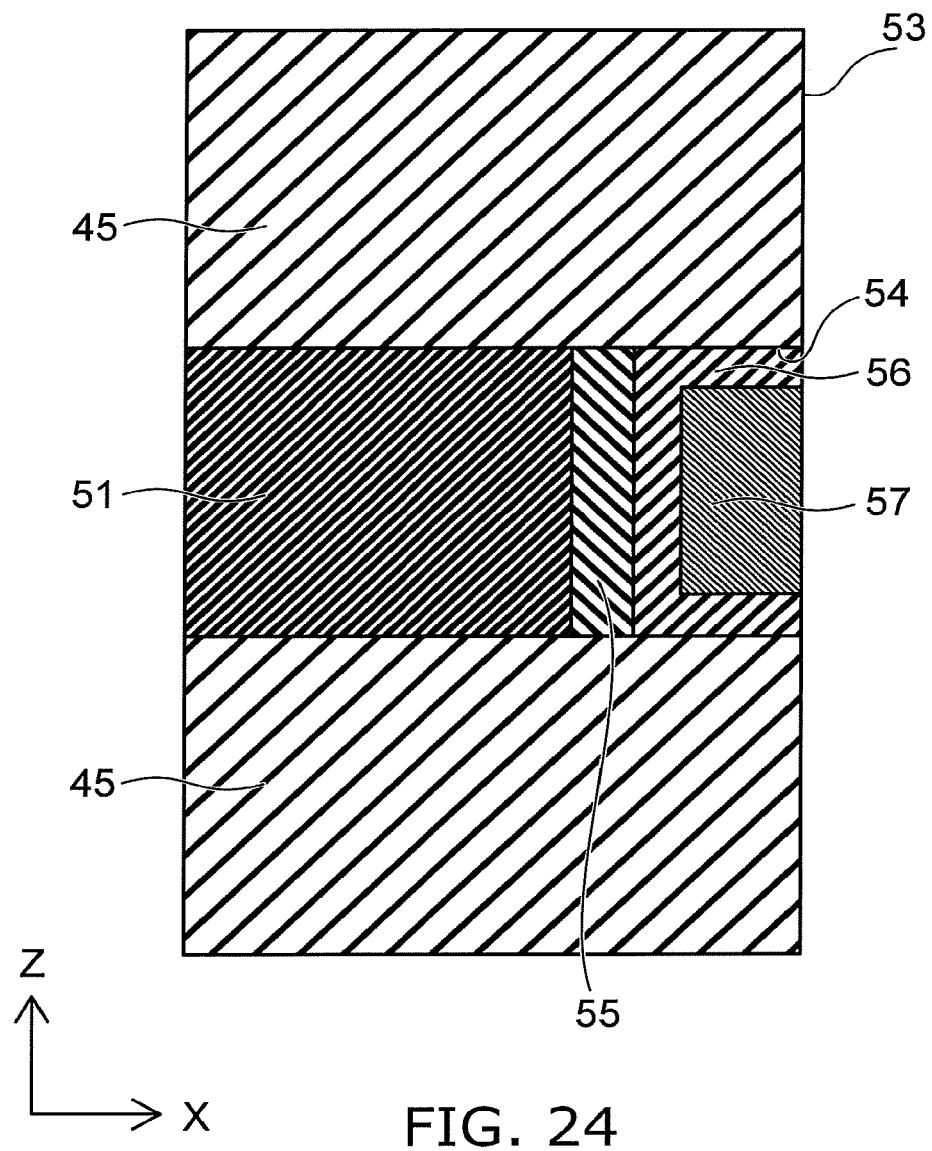
Figure 25:
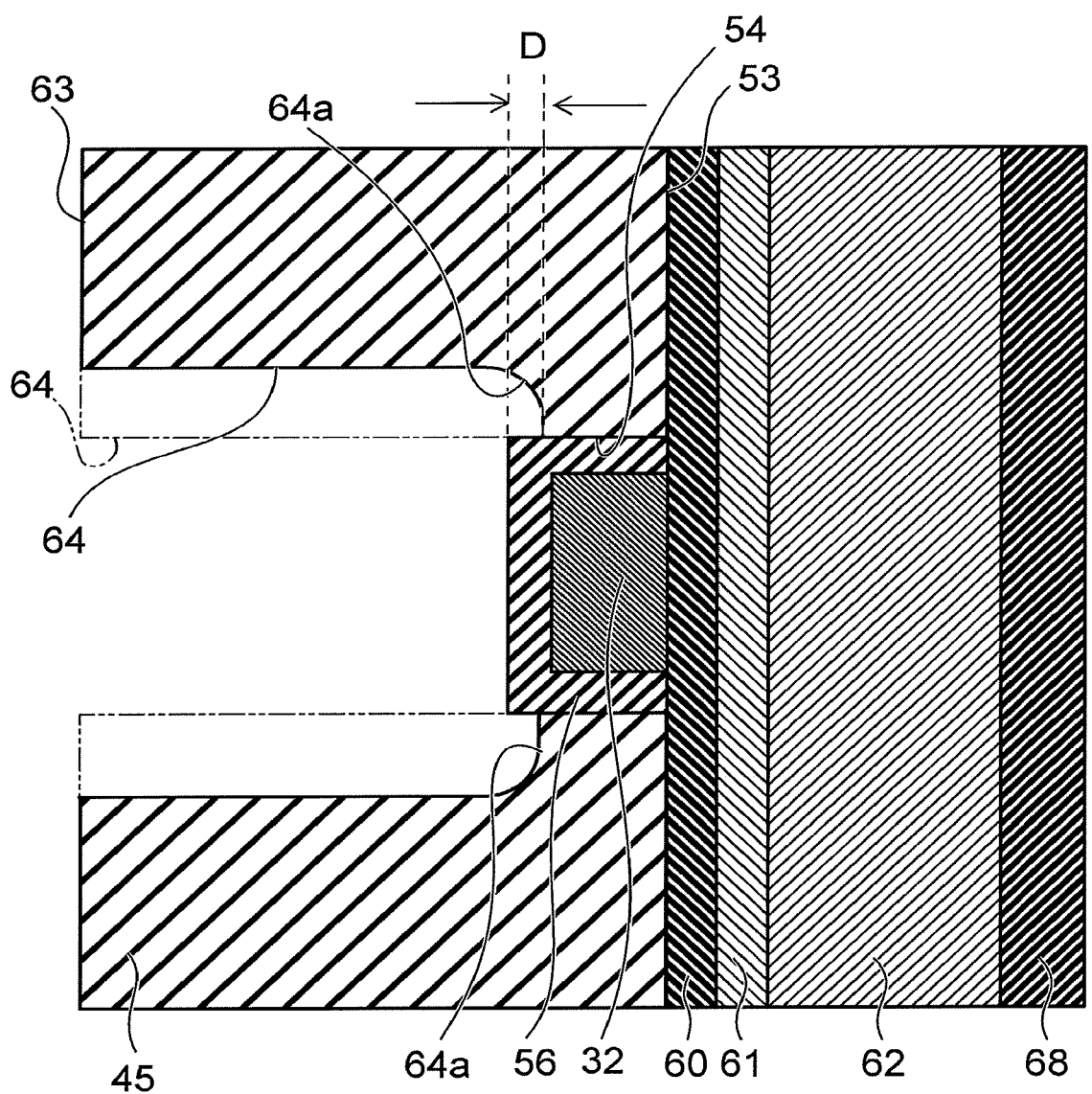

FIG. 23 to FIG. 25 are cross-sectional views showing the method for manufacturing the semiconductor memory device according to the embodiment.

First, as shown in FIG. 3, the insulating film 11 and the cell source line 15 are formed on the silicon substrate 10; and the stacked body 52 is formed by alternately stacking the inter-layer insulating films 45 and the sacrificial films 51 on the cell source line 15. At this time, in the embodiment, the sacrificial films 51 are formed to be thick compared to those of the first to third embodiments described above.

Then, as shown in FIG. 23, the memory trench 53 and the recess 54 are formed in the stacked body 52. In the embodiment, compared to the third embodiment described above, the length in the Z-direction of the recess 54 also is long because the sacrificial film 51 is preformed to be thick. Therefore, the process of enlarging the recess 54 by wet etching is not implemented.

Then, as shown in FIG. 24, the cover layer 55 is formed; the HfSiO layer 56 and the silicon film 57 are formed inside the memory trench 53 and inside the recess 54, and are recessed to cause the HfSiO layer 56 and the silicon film 57 to remain inside the recess 54. At this time, over-etching of the HfSiO layer 56 is not performed.

Then, the processes shown in FIG. 11 to FIG. 13 are implemented. Thereby, the silicon oxide film 60, the silicon film 61, the silicon film 62, and the insulating member 68 are formed inside the memory trench 53.

Then, the slits 63 and the recesses 64 are formed in the stacked body 52 by implementing the processes shown in FIG. 12 and FIG. 13. In the embodiment, compared to the third embodiment described above, the length in the Z-direction of the recess 64 is long because the sacrificial films 51 are preformed to be thick.

Then, as shown in FIG. 25, by performing wet etching of the inter-layer insulating film 45, the recess 64 is enlarged; the length in the Z-direction of the recess 64 is increased; and the inner portion 64a is formed. However, in the embodiment, compared to the third embodiment described above, the etching amount is set to be low because the length in the Z-direction of the recess 64 is long. Therefore, compared to the third embodiment, the depth D of the inner portion 64a is shallow.

Then, as shown in FIG. 22, the insulating layer 42, the high dielectric constant layer 43, the titanium nitride layer 67a (the barrier metal layer 31b), and the tungsten film 67b (the main portion 31a) are formed in this order on the inner surface of the recess 64. At this time, the insulating layer 42 enters the inner portion 64a; but the high dielectric constant layer 43 and the titanium nitride layer 67a are caused not to enter the inner portion 64a. Thereafter, the manufacturing method is similar to that of the first embodiment described above.

Effects of the embodiment will now be described.

According to the embodiment, the concentration of the electric field can be relaxed because the blocking insulating film 44 is disposed to surround the corners of the floating gate electrode 32.

Also, because the sacrificial film 51 is formed to be thick in the process shown in FIG. 3 according to the embodiment, the length in the Z-direction of the floating gate electrode 32 can be long and the volume can be increased without forming the thick sheet portion 32b in the floating gate electrode 32 by over-etching of the HfSiO layer 56 as in the first embodiment described above and without enlarging the recess 54 as in the third embodiment described above. Also, the thickness of the control gate electrode 31 can be ensured even when setting the etching amount to be low in the process shown in FIG. 25. Thereby, the processes can be simplified while ensuring the reliability of the semiconductor memory device 4.

Otherwise, the configuration, the manufacturing method, the operations, and the effects of the embodiment are similar to those of the first embodiment described above.

Fifth Embodiment

A fifth embodiment will now be described.

Figure 26:
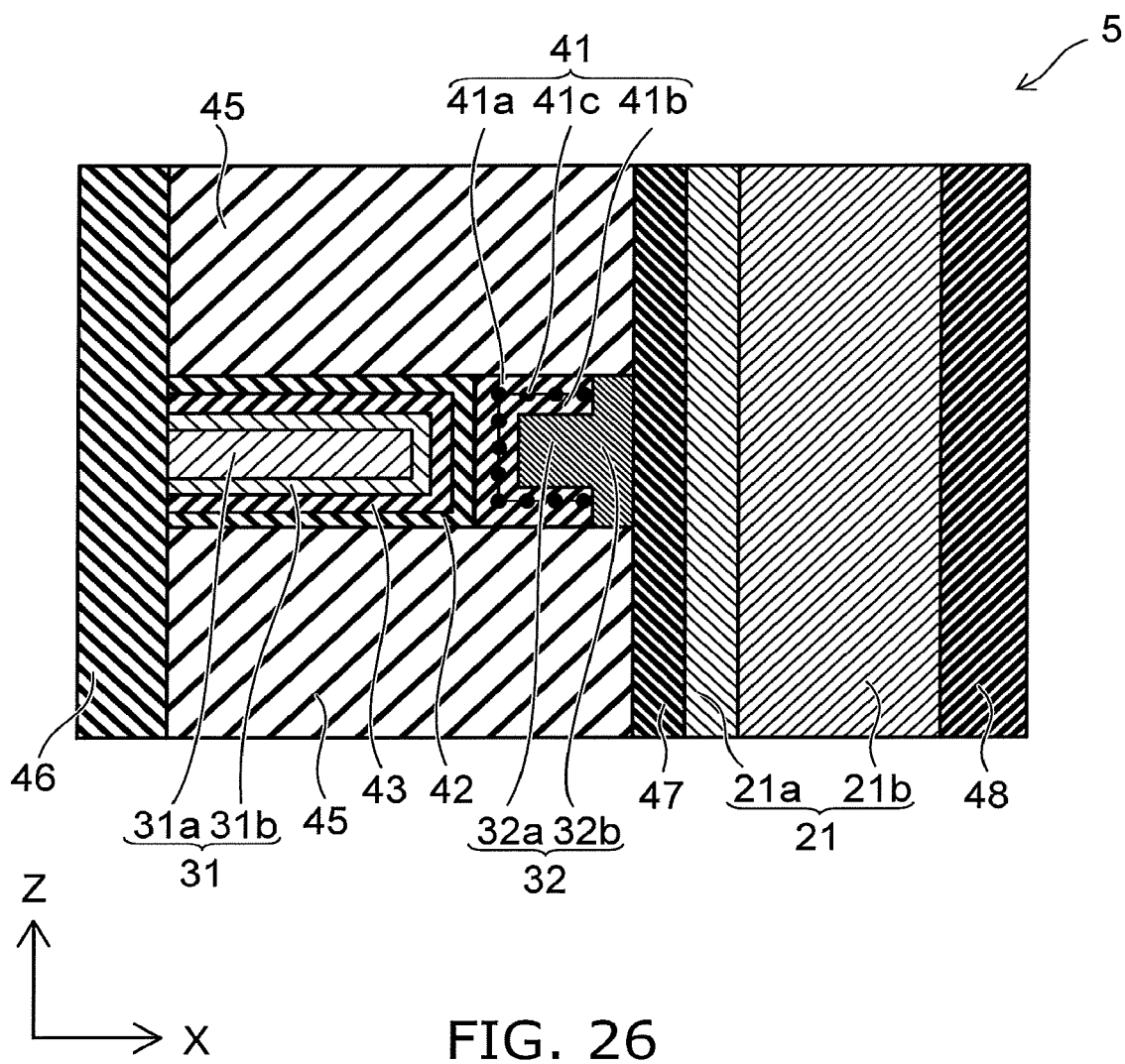
FIG. 26 is a cross-sectional view showing a semiconductor memory device according to a fifth embodiment.

FIG. 26 is a cross-sectional view showing a semiconductor memory device according to the embodiment.

FIG. 26 shows a region corresponding to region A of FIG. 1A.

As shown in FIG. 26, the semiconductor memory device 5 according to the embodiment differs from the semiconductor memory device 1 according to the first embodiment described above (referring to FIG. 2) in that an outer layer 41a and an inner layer 41b that are insulative are provided in the high dielectric constant layer 41; and fine particles 41c that are made of a metal such as ruthenium (Ru), etc., are provided between the outer layer 41a and the inner layer 41b. The outer layer 41a contacts the insulating layer 42 and the inter-layer insulating film 45; and the inner layer 41b contacts the floating gate electrode 32. The fine particles 41c do not contact the tunneling insulating film 47 because the high dielectric constant layer 41 is separated from the tunneling insulating film 47 by the thick sheet portion 32b of the floating gate electrode 32.

The combination of the materials of the outer layer 41a and the inner layer 41b is, for example, a combination in which both the outer layer 41a and the inner layer 41b are made of silicon nitride (SiN), or a combination in which the outer layer 41a is made from silicon oxide (SiO) and the inner layer 41b is made of silicon oxynitride (SiON). Also, although the fine particles 41c are disposed in a layer configuration along the interface between the outer layer 41a and the inner layer 41b, a continuous layer may not be formed; or a continuous layer may be formed.

A method for manufacturing the semiconductor memory device according to the embodiment will now be described.

Figure 27:
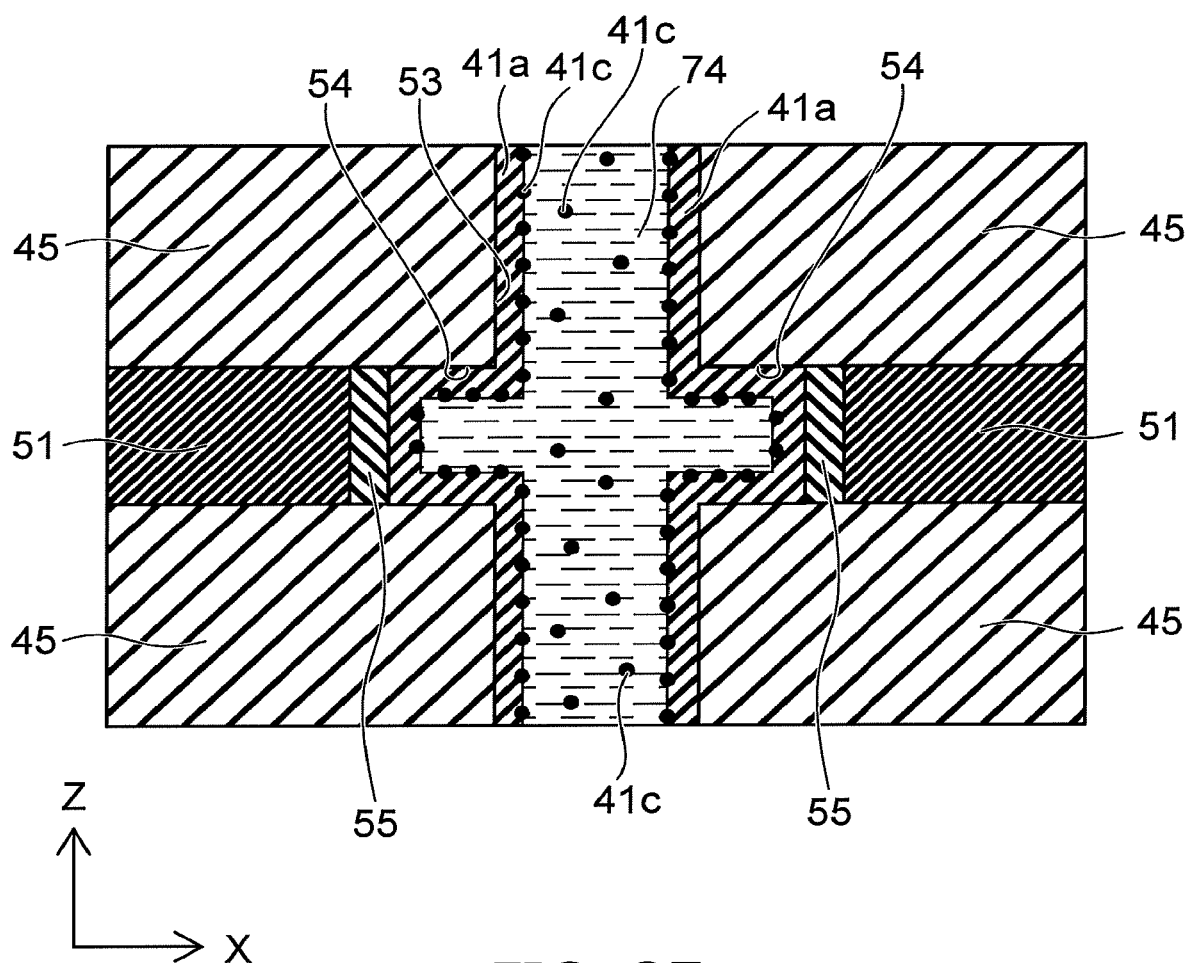
FIG. 27 is a cross-sectional view showing a method for manufacturing the semiconductor memory device according to the fifth embodiment.

FIG. 27 is a cross-sectional view showing the method for manufacturing the semiconductor memory device according to the embodiment.

First, the processes shown in FIG. 3 to FIG. 6 are implemented.

Then, as shown in FIG. 27, an outer layer 41a is formed in the memory trench 53 and on the inner surface of the recess 54. Then, a liquid 74 that includes a metal, e.g., ruthenium, is supplied to the memory trench 53 and the interior of the recess 54. The liquid 74 is, for example, an alkaline aqueous solution in which ruthenium ions are dissolved, or an organic solvent in which fine particles of ruthenium are dispersed in a colloidal form. For example, the temperature of the liquid 74 is set to 0 to 100° C., e.g., room temperature; and, for example, the immersion time is set to 10 to 600 seconds. Thereby, the fine particles 41c that are made of ruthenium are adhered to the surface of the outer layer 41a. Subsequently, the liquid 74 is removed by cleaning.

Then, as shown in FIG. 26, an inner layer 41b is formed on the outer layer 41a. Thereby, the fine particles 41c are covered with the inner layer 41b; and the fine particles 41c are disposed at the interface between the outer layer 41a and the inner layer 41b. The subsequent processes are similar to those of the first embodiment described above.

Effects of the embodiment will now be described.

In the semiconductor memory device 5 according to the embodiment, the fine particles 41c that are made of ruthenium are provided inside the high dielectric constant layer 41 as shown in FIG. 26. Therefore, the electrons that are injected from the silicon pillar 21 via the tunneling insulating film 47 can be stopped effectively by the fine particles 41c. Thereby, even in the case where the floating gate electrode 32 is formed to be thin in the X-direction, the electrons that pass through the floating gate electrode 32 to the blocking insulating film 44 are suppressed; and the injection efficiency of the electrons for the floating gate electrode 32 can be maintained to be high. Also, the work function of the fine particles 41c is higher than the work function of the floating gate electrode 32 because the work function of the ruthenium included in the fine particles 41c is about 4.68 eV; and the work function of the silicon included in the floating gate electrode 32 is about 4.15 eV. Thereby, the retention of the injected electrons is high; accordingly, the data retention characteristics of the memory cells are good.

Also, according to the embodiment, the adhesion amount of the ruthenium can be uniform between the devices and within the device because the ruthenium is adhered over the outer layer 41a by wet processing using the liquid 74.

Otherwise, the configuration, the manufacturing method, the operations, and the effects of the embodiment are similar to those of the first embodiment described above.

Sixth Embodiment

A sixth embodiment will now be described.

Figure 28:
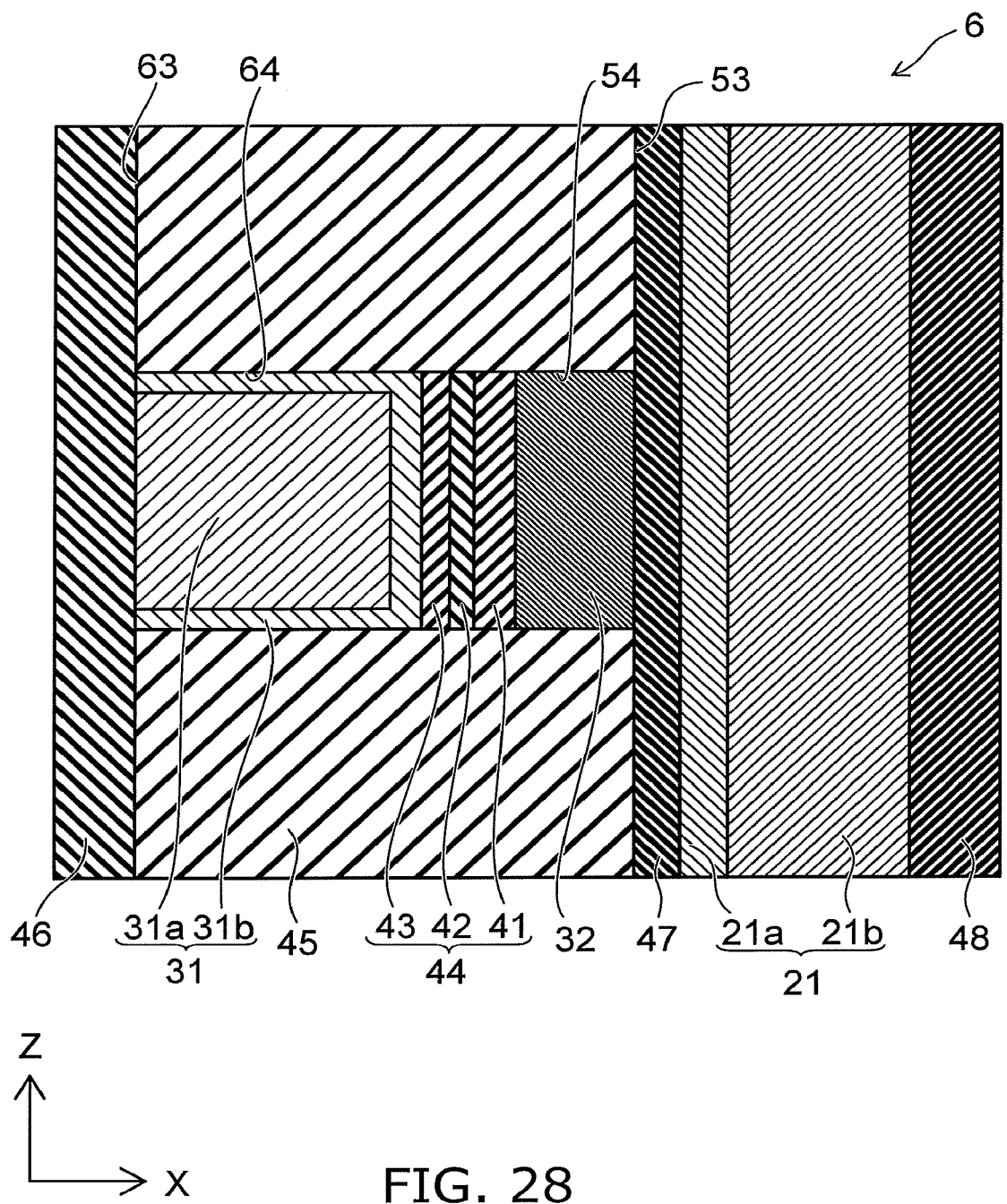
FIG. 28 is a cross-sectional view showing a semiconductor memory device according to a sixth embodiment.

FIG. 28 is a cross-sectional view showing a semiconductor memory device according to the embodiment.

FIG. 28 shows a region corresponding to region A of FIG. 1A.

As shown in FIG. 28, the semiconductor memory device 6 according to the embodiment differs from the semiconductor memory device 1 according to the first embodiment described above (referring to FIG. 2) in that the configurations of the high dielectric constant layer 41, the insulating layer 42, and the high dielectric constant layer 43 each are planar configurations spreading along the YZ plane; and the high dielectric constant layer 41, the insulating layer 42, and the high dielectric constant layer 43 are not disposed on and under the floating gate electrode 32 and on and under the control gate electrode 31. The high dielectric constant layer 41 is made from, for example, silicon nitride; the insulating layer 42 is made of, for example, silicon oxide; and the high dielectric constant layer 43 is made of, for example, hafnium silicon oxide (HfSiO).

When viewed from the Y-direction, the configuration of the floating gate electrode 32 is a rectangular configuration instead of a T-shaped configuration because the configuration of the high dielectric constant layer 41 is a straight line configuration. Also, the floating gate electrode 32 is disposed over the total length of the recess 54 in the Z-direction. In other words, the entire upper surface of the floating gate electrode 32 and the entire lower surface of the floating gate electrode 32 contact the inter-layer insulating films 45. Also, when viewed from the Y-direction, the control gate electrode 31 is disposed over the total length of the recess 64 in the Z-direction because the configurations of the insulating layer 42 and the high dielectric constant layer 43 are straight line configurations. In other words, the entire upper surface of the control gate electrode 31 and the entire lower surface of the control gate electrode 31 contact the inter-layer insulating films 45.

A method for manufacturing the semiconductor memory device according to the embodiment will now be described.

FIG. 29 to FIG. 33 are cross-sectional views showing the method for manufacturing the semiconductor memory device according to the embodiment.

Figure 29:
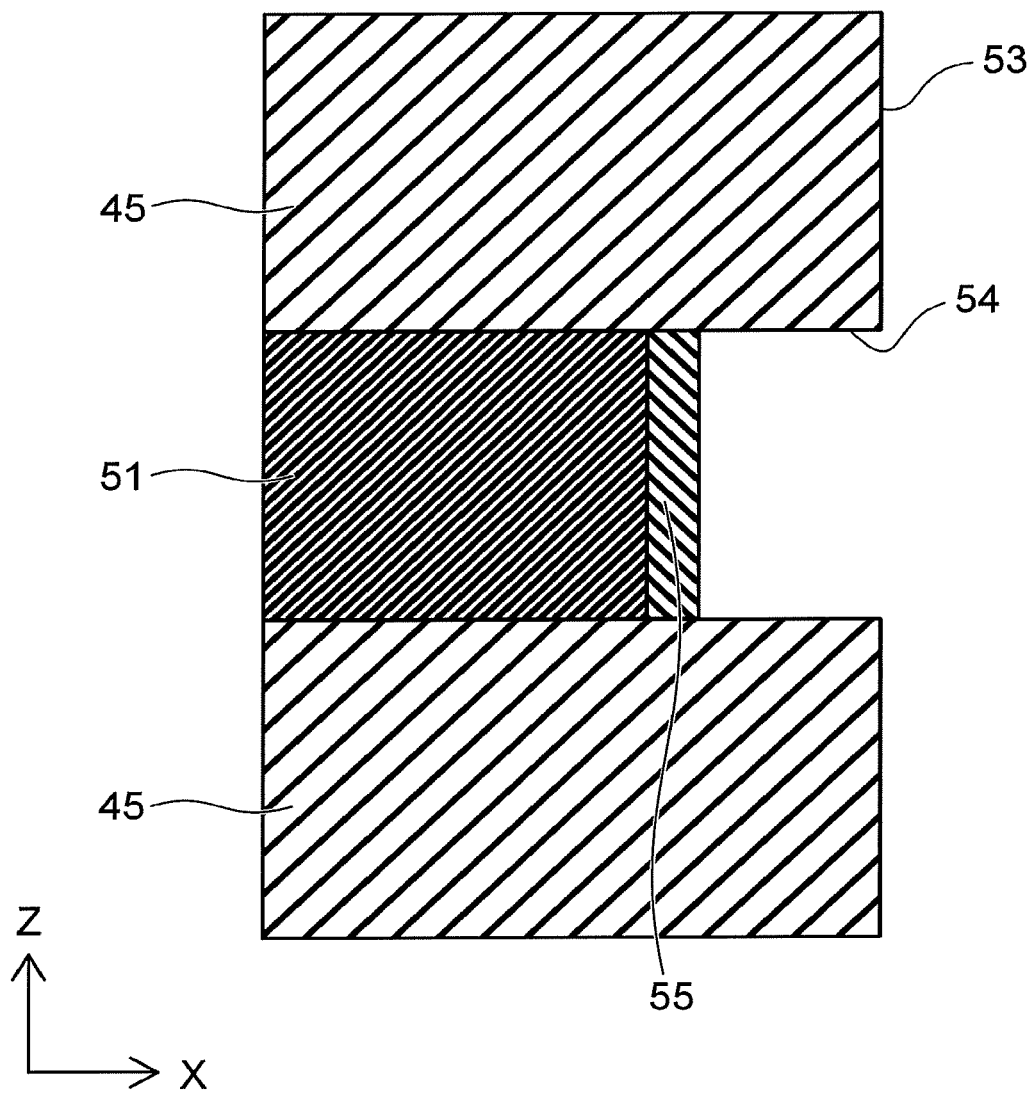
FIG. 29 to FIG. 33 are cross-sectional views showing a method for manufacturing the semiconductor memory device according to the sixth embodiment.

First, the intermediate structure body shown in FIG. 29 is made by implementing the processes shown in FIG. 3 to FIG. 6.

Figure 30:
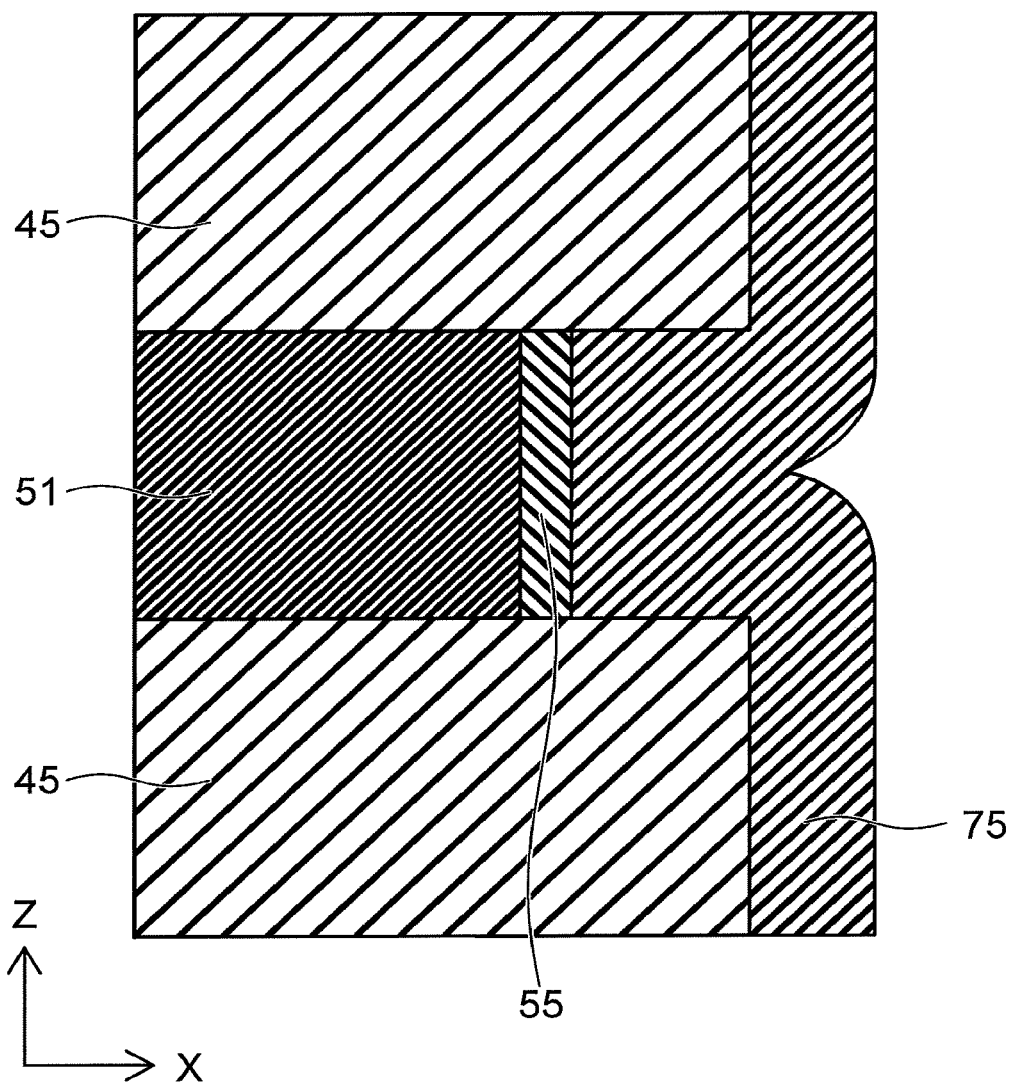

Then, as shown in FIG. 30, a silicon nitride film 75 is formed to fill the interior of the recess 54 by depositing silicon nitride via the memory trench 53.

Figure 31:
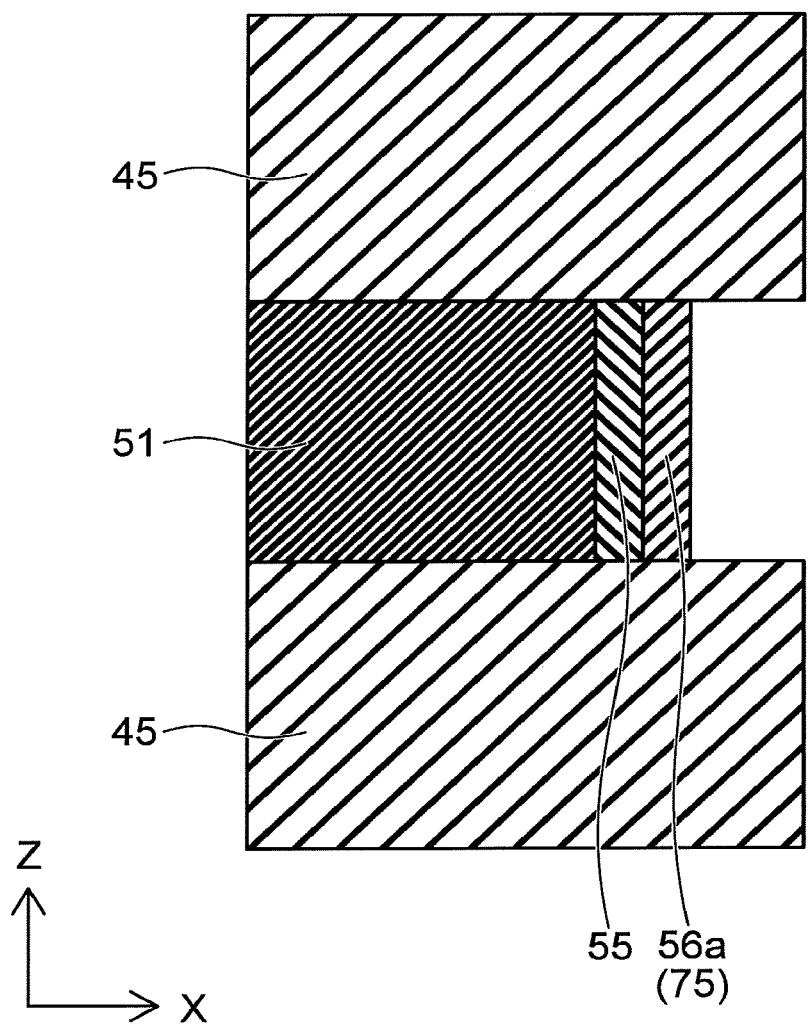

Then, as shown in FIG. 31, by performing wet etching, the silicon nitride film 75 is recessed and caused to remain only on the back surface of the recess 54. At this time, the silicon nitride film 75 that is on the entire side surface of the memory trench 53, on the greater part of the upper surface of the recess 54, and on the greater part of the lower surface of the recess 54 is removed; and the inter-layer insulating films 45 are exposed. Thereby, the silicon nitride film 75 becomes a silicon nitride layer 56a that has a band configuration having the X-direction as the thickness direction, the Z-direction as the width direction, and the Y-direction as the longitudinal direction. The silicon nitride layer 56a is a layer that is divided along the Y-direction in a subsequent process to become the high dielectric constant layer 41 having the planar configuration spreading along the YZ plane.

Figure 32:
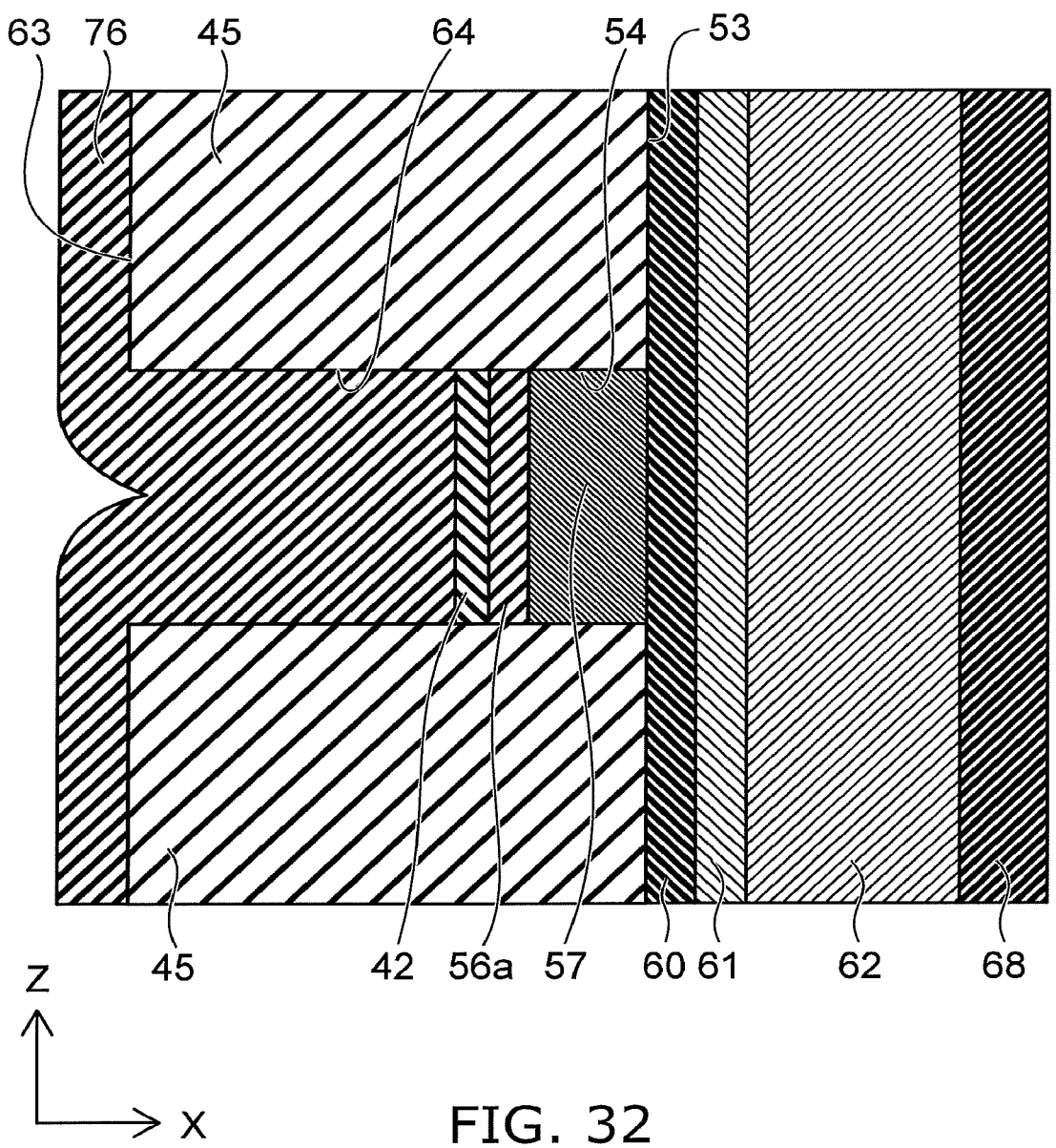

Then, as shown in FIG. 32, the silicon film 57 is formed via the memory trench 53 and is caused to remain inside the recess 54 by being recessed. Then, the silicon oxide film 60, the silicon films 61 and 62, and the insulating member 68 are formed inside the memory trench 53 using a method similar to that of the first embodiment described above.

Then, by implementing the processes shown in FIG. 12 and FIG. 13, the slits 63 are formed in the stacked body 52; and the recesses 64 are formed by removing the sacrificial films 51 using the cover layer 55 as a stopper.

Then, as shown in FIG. 32, the silicon nitride film 75 is exposed at the back surface of the recess 64 by removing the cover layer 55. Then, the insulating layer 42 that is made of silicon oxide is formed by oxidizing the exposed surface of the silicon nitride film 75. The cover layer 55 may be used as the insulating layer 42 as-is without being removed. Then, a HfSiO film 76 that is thick is formed to fill the interior of the recess 64 by depositing hafnium silicon oxide (HfSiO) inside the slit 63.

Figure 33:
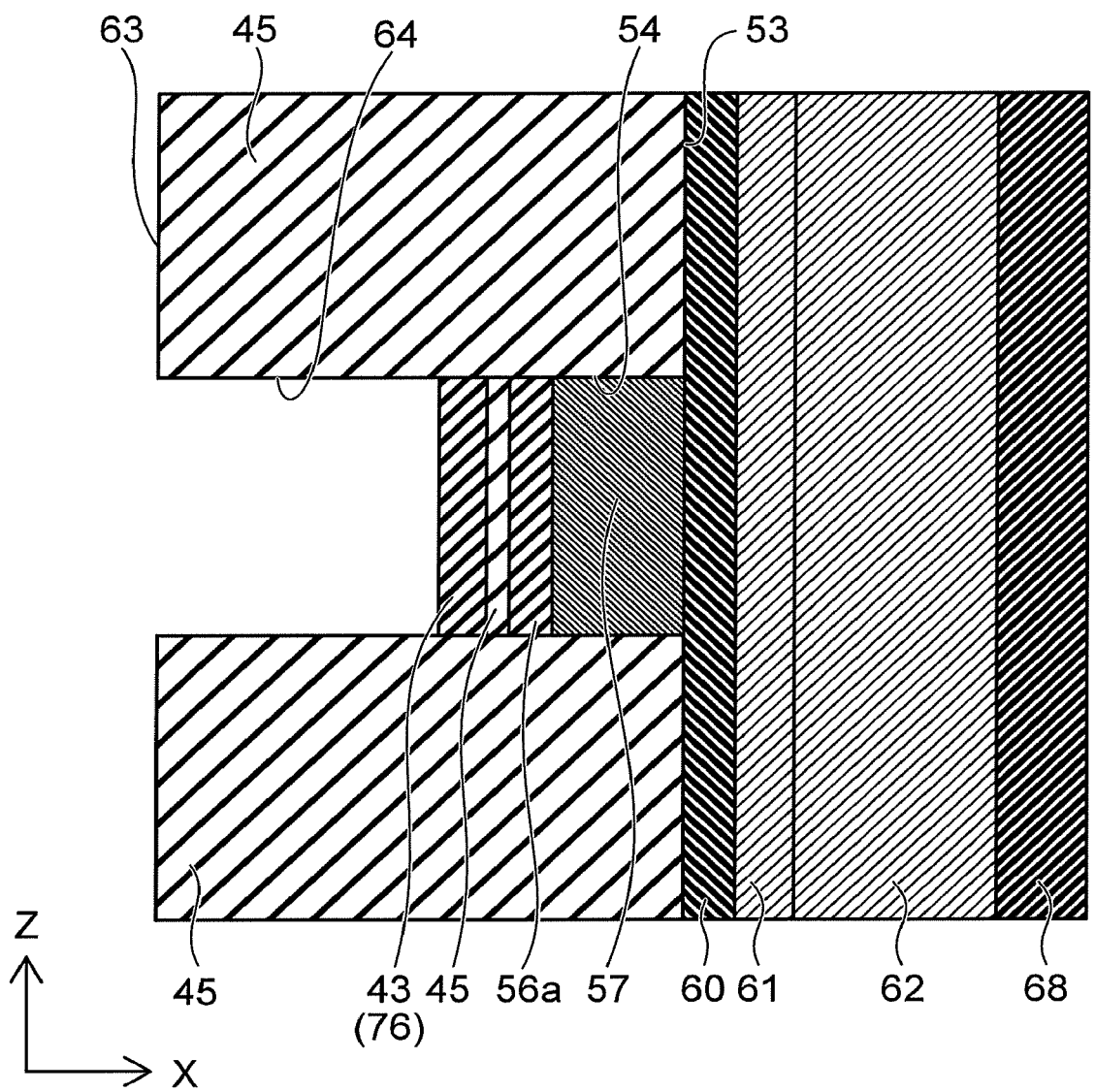

Then, as shown in FIG. 33, the HfSiO film 76 is recessed by wet etching and caused to remain only on the back surface of the recess 64. At this time, the HfSiO film 76 that is on the entire side surface of the slit 63, on the greater part of the upper surface of the recess 64, and on the greater part of the lower surface of the recess 64 is removed; and the inter-layer insulating films 45 are exposed. Thereby, the HfSiO film 76 is patterned into the high dielectric constant layer 43 having the planar configuration.

Then, as shown in FIG. 28, using a method similar to that of the first embodiment described above, the control gate electrode 31 is formed inside the recess 64; and the insulating member 46 is filled into the slit 63. Thereafter, the manufacturing method is similar to that of the first embodiment described above.

Effects of the embodiment will now be described.

In the embodiment, the high dielectric constant layer 41 can be formed in a planar configuration by forming the thick silicon nitride film 75 to fill the interior of the recess 54 in the process shown in FIG. 30, and by recessing the silicon nitride film 75 to cause the silicon nitride film 75 to remain only on the back surface of the recess 54 in the process shown in FIG. 31. Subsequently, the length in the Z-direction of the floating gate electrode 32 can be lengthened by forming the floating gate electrode 32. Thereby, the gate length of the memory cell transistor lengthens; the volume of the floating gate electrode 32 becomes large; and the reliability of the semiconductor memory device 6 increases.

Also, in the embodiment, the high dielectric constant layer 43 can be formed in a planar configuration by forming the thick HfSiO film 76 to fill the interior of the recess 64 in the process shown in FIG. 32, and by recessing the HfSiO film 76 to cause the HfSiO film 76 to remain only on the back surface of the recess 64 in the process shown in FIG. 33. Subsequently, the length in the Z-direction of the control gate electrode 31 can be lengthened by forming the control gate electrode 31. Thereby, the interconnect resistance of the control gate electrode 31 is reduced; and the reliability and operation speed of the semiconductor memory device 6 can be increased.

Otherwise, the configuration, the manufacturing method, the operations, and the effects of the embodiment are similar to those of the first embodiment described above.

Seventh Embodiment

A seventh embodiment will now be described.

Figure 34:
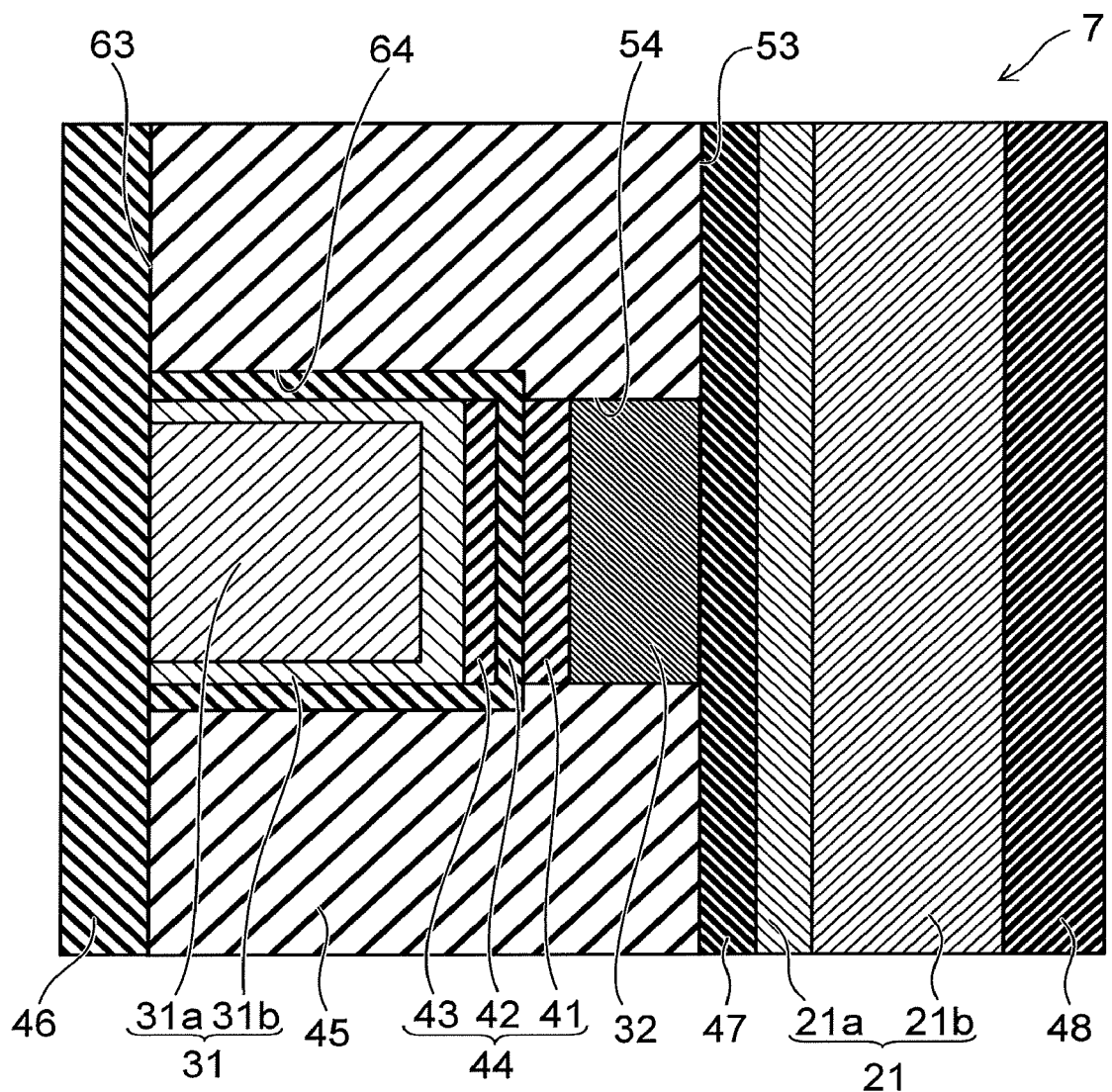
FIG. 34 is a cross-sectional view showing a semiconductor memory device according to a seventh embodiment.

FIG. 34 is a cross-sectional view showing a semiconductor memory device according to the embodiment.

FIG. 34 shows a region corresponding to region A of FIG. 1A.

As shown in FIG. 34, the semiconductor memory device 7 according to the embodiment differs from the semiconductor memory device 6 according to the sixth embodiment described above (referring to FIG. 28) in that the insulating layer 42 is disposed also on the upper surface of the control gate electrode 31 and on the lower surface of the control gate electrode 31. The configurations of the high dielectric constant layers 41 and 43 are planar configurations spreading along the YZ plane.

In the example shown in the embodiment, there are cases where a distinct interface between the insulating layer 42 and the inter-layer insulating film 45 is not observed because the insulating layer 42 is made from silicon oxide and the inter-layer insulating film 45 also is made of silicon oxide. In such a case, the configuration of the semiconductor memory device 7 appears to be similar to the configuration of the semiconductor memory device 6. However, even in such a case, generally the position of the interface between the insulating layer 42 and the control gate electrode 31 in the Z-direction and the position of the interface between the inter-layer insulating film 45 and the floating gate electrode 32 in the Z-direction do not match.

A method for manufacturing the semiconductor memory device according to the embodiment will now be described.

FIG. 35 to FIG. 40 are cross-sectional views showing the method for manufacturing the semiconductor memory device according to the embodiment.

Figure 35:
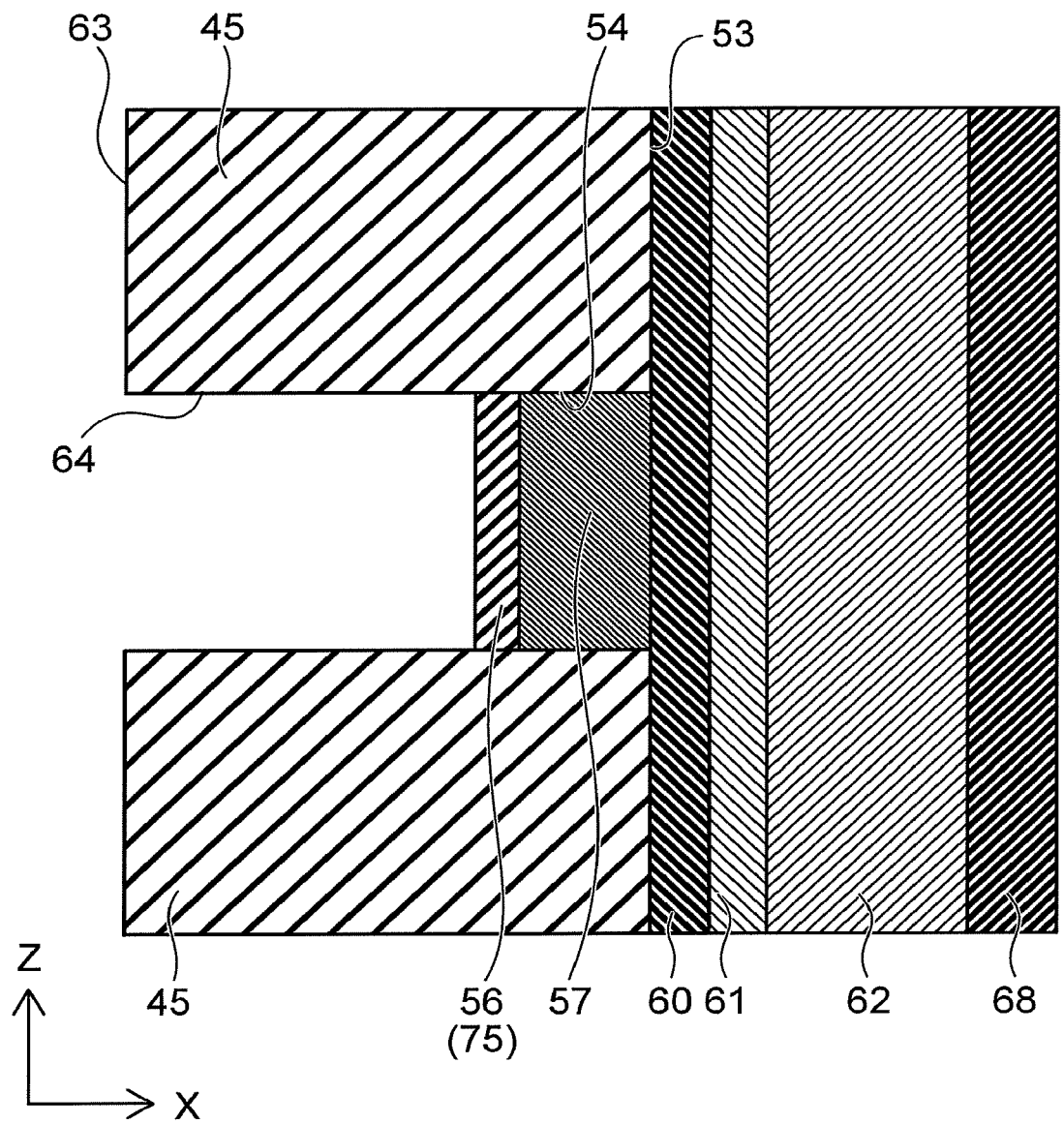
FIG. 35 to FIG. 40 are cross-sectional views showing a method for manufacturing the semiconductor memory device according to the seventh embodiment.

First, a structure body such as that shown in FIG. 35 is made by a method similar to that of the sixth embodiment described above. Namely, the HfSiO layer 56 shown in FIG. 35 is formed by recessing the thick silicon nitride film 75 to be thin as shown in FIG. 30 and FIG. 31.

Figure 36:
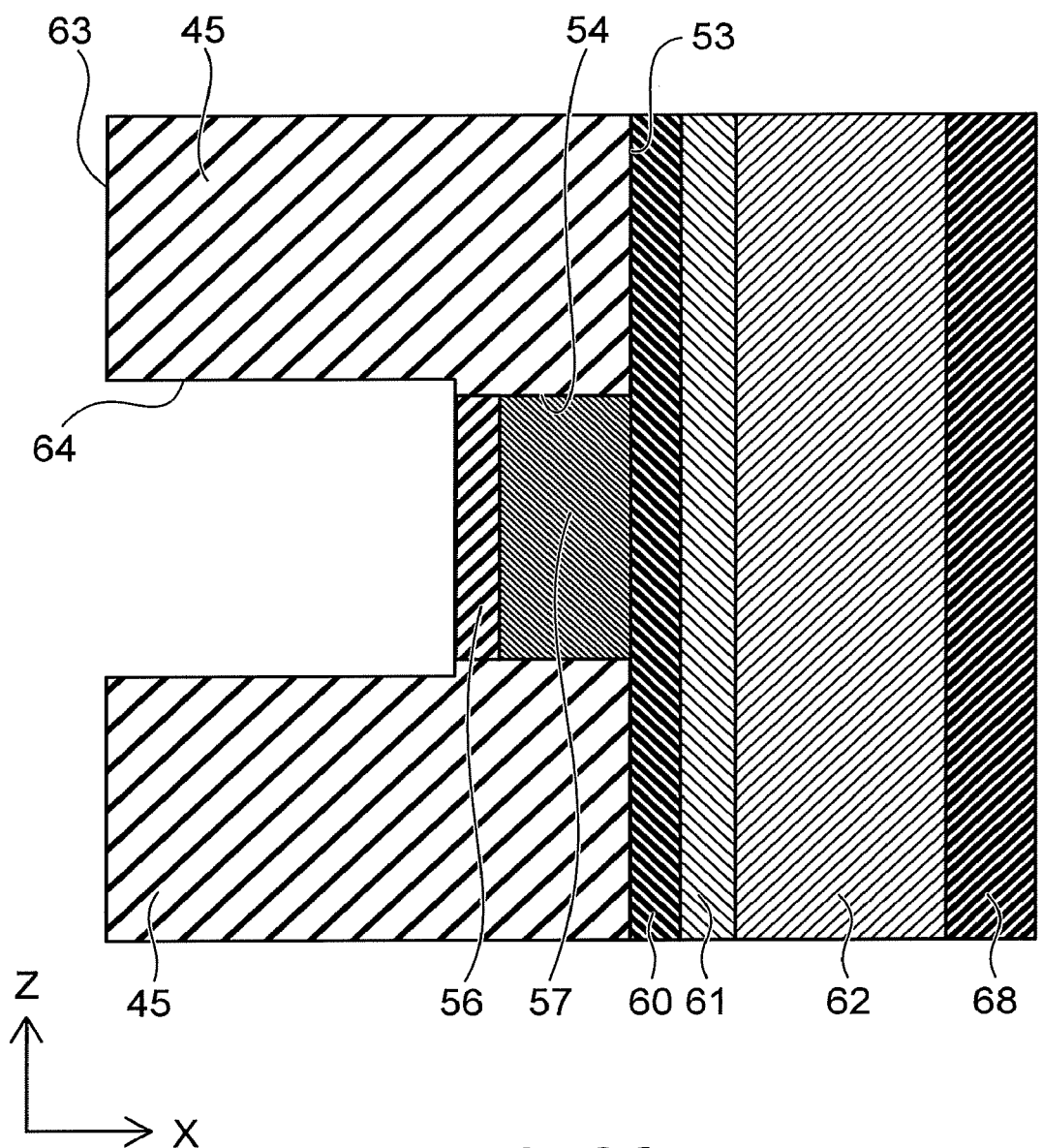

Then, as shown in FIG. 36, the recess 64 is enlarged in the Z-direction by performing wet etching of the inter-layer insulating films 45 via the slit 63.

Figure 37:
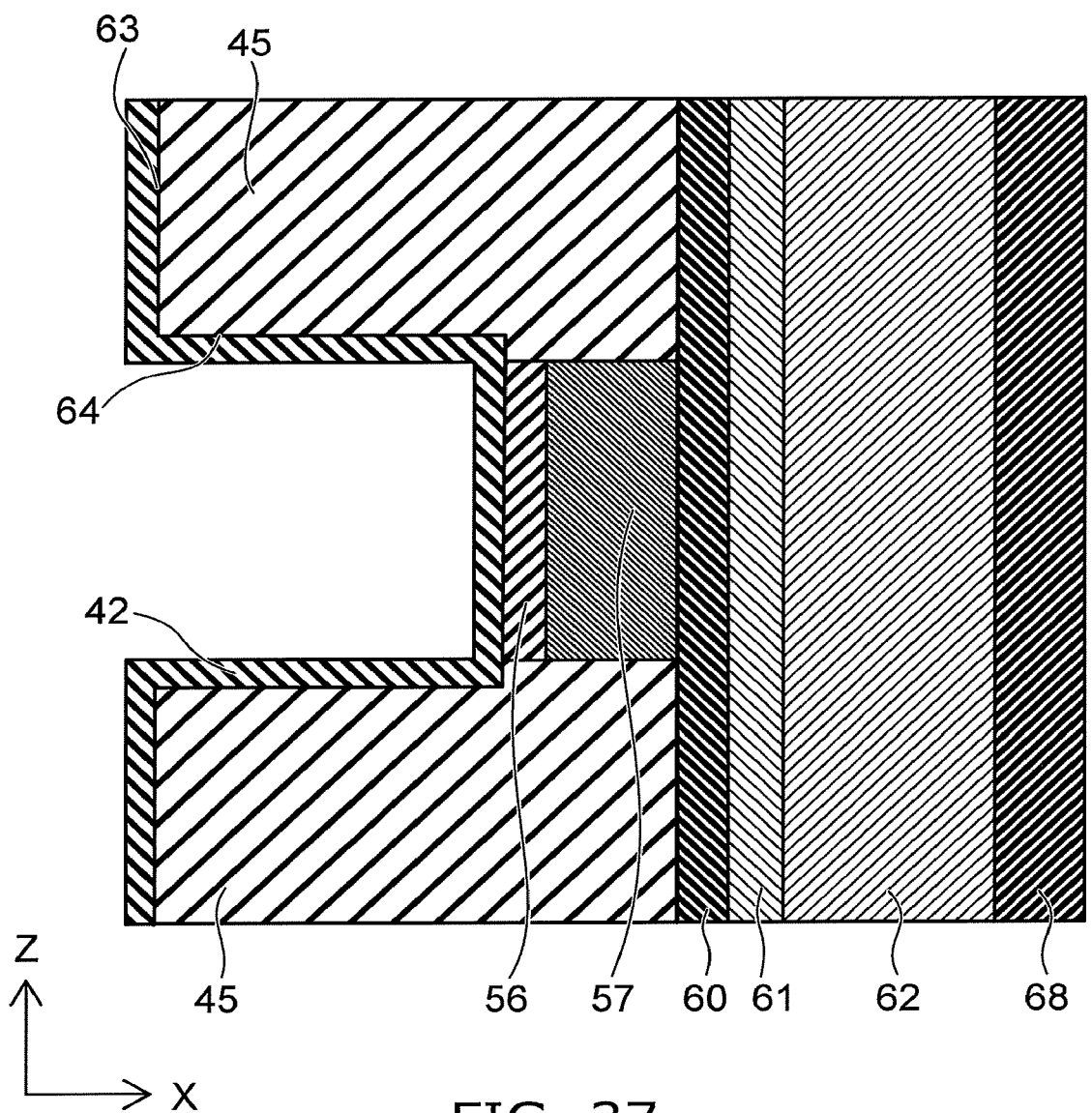

Then, as shown in FIG. 37, the insulating layer 42 is formed by depositing silicon oxide on the side surface of the slit 63 and on the inner surface of the enlarged recess 64.

Figure 38:
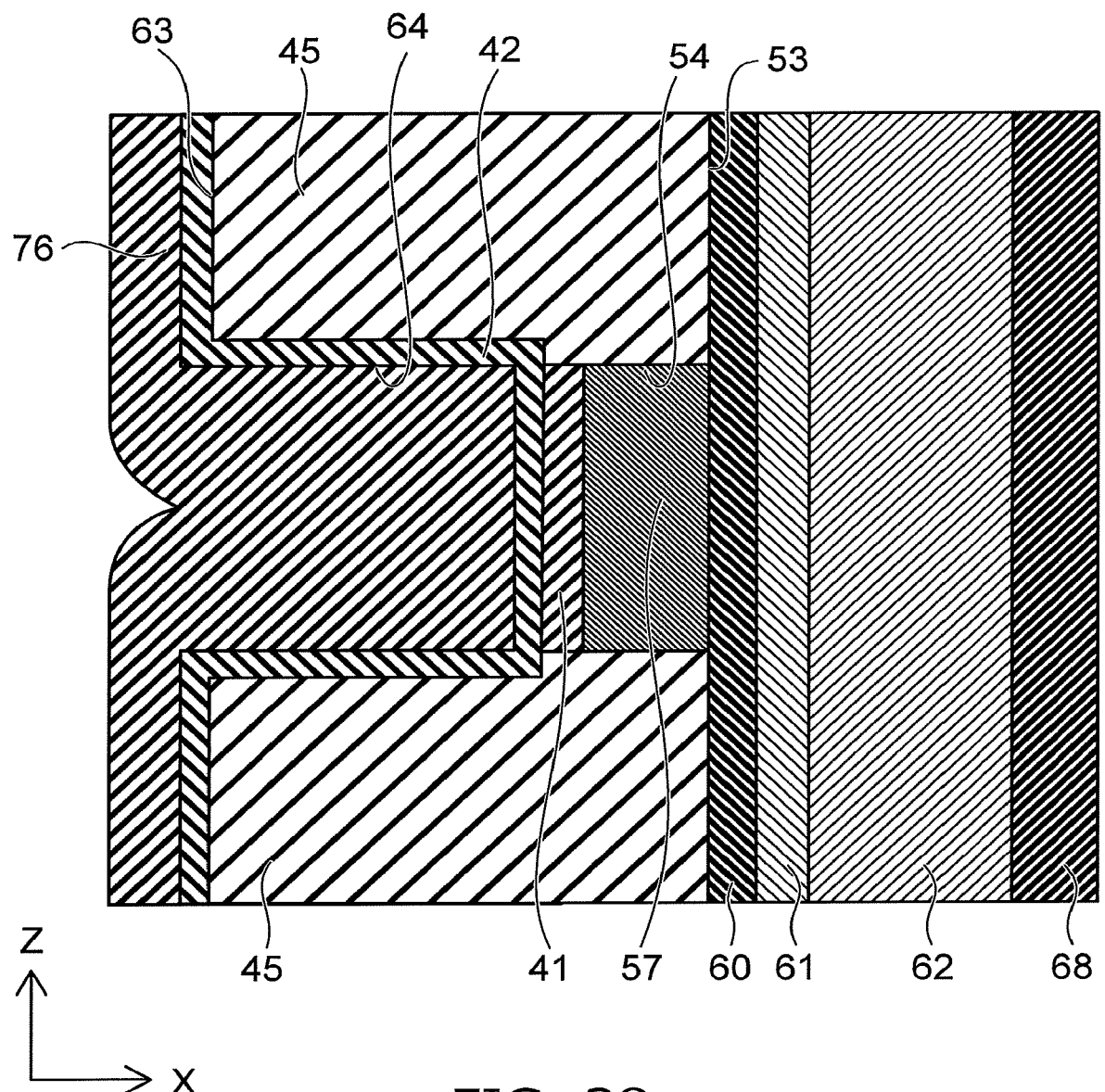

Then, as shown in FIG. 38, the thick HfSiO film 76 is formed by depositing hafnium silicon oxide (HfSiO) inside the slit 63. The HfSiO film 76 is formed to fill the interior of the recess 64.

Figure 39:
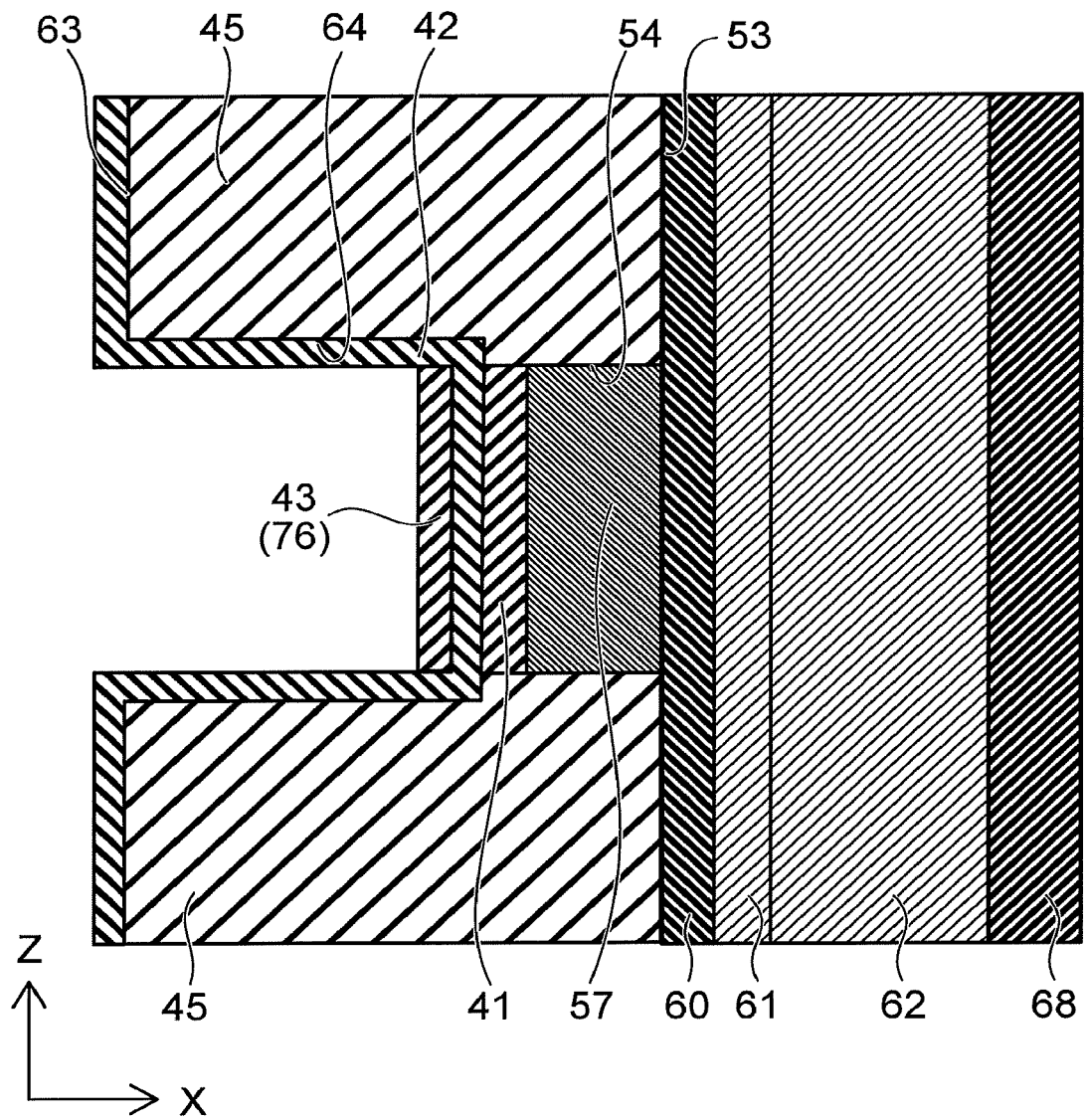

Then, as shown in FIG. 39, the HfSiO film 76 is recessed using wet etching and caused to remain only on the back surface of the recess 64. Thereby, the HfSiO film 76 is patterned into the high dielectric constant layer 43 having the planar configuration.

Figure 40:
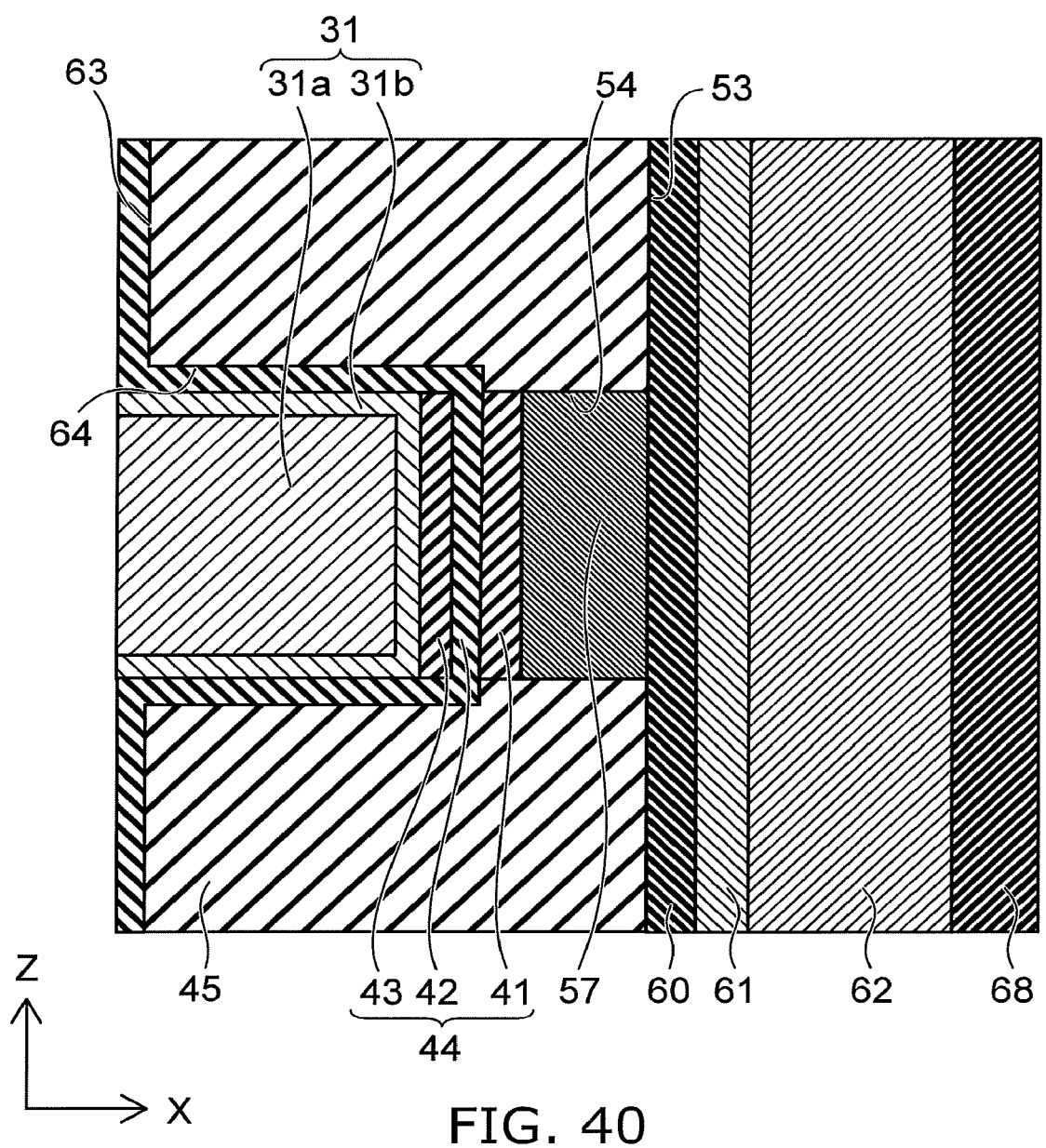

Then, as shown in FIG. 40, the control gate electrode 31 is formed using a method similar to that of the first embodiment described above. Thereafter, the manufacturing method is similar to that of the first embodiment described above.

Effects of the embodiment will now be described.

In the embodiment as well, similarly to the sixth embodiment described above, the length in the Z-direction of the floating gate electrode 32 is lengthened; and the reliability of the memory cell transistor can be increased.

Also, by enlarging the recess 64 in the process shown in FIG. 36, and by subsequently forming the insulating layer 42 and forming the high dielectric constant layer 43 in the planar configuration, the length in the Z-direction of the control gate electrode 31 is lengthened; and the interconnect resistance can be reduced.

Otherwise, the configuration, the manufacturing method, the operations, and the effects of the embodiment are similar to those of the sixth embodiment described above.

Eighth Embodiment

An eighth embodiment will now be described.

Figure 41:
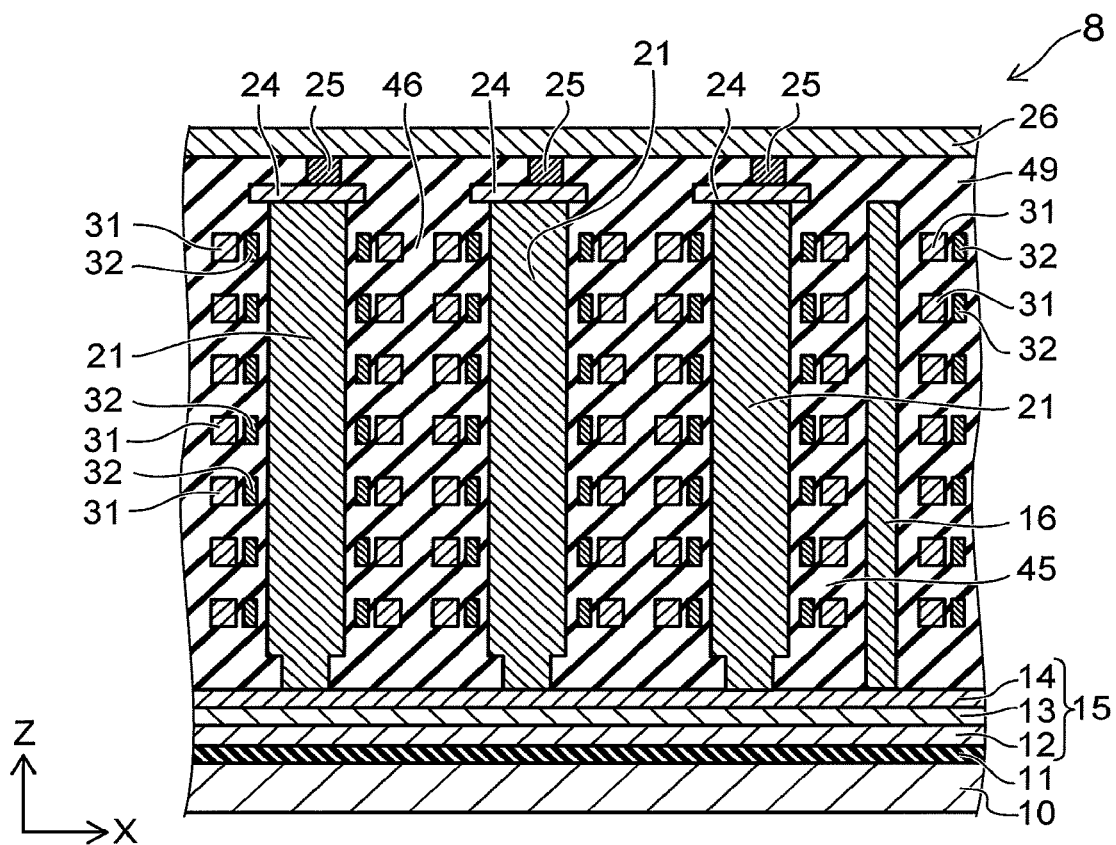
FIG. 41 is a cross-sectional view showing a semiconductor memory device according to an eighth embodiment.

FIG. 41 is a cross-sectional view showing a semiconductor memory device according to the embodiment.

In the semiconductor memory device 8 according to the embodiment as shown in FIG. 41, the silicon pillar 21 between the cell source line 15 and each of the connection members 24 is one silicon pillar 21 and is not subdivided into two. In other words, the insulating member 48 is not disposed between the two silicon pillars 21 arranged in the X-direction.

For example, such a semiconductor memory device 8 can be manufactured as follows. First, similarly to the first embodiment, the processes shown in FIG. 3 to FIG. 10 are implemented. Then, when implementing the process shown in FIG. 11, the entire interior of the memory trench 53 is filled with the silicon film 62 at this time; and the insulating member 68 is not formed. Then, the processes shown in FIG. 12 to FIG. 15 are implemented.

Otherwise, the configuration, the manufacturing method, the operations, and the effects of the embodiment are similar to those of the first embodiment described above. Also, the second to seventh embodiments described above may be combined in the embodiment.

According to the embodiments described above, a semiconductor memory device and a method for manufacturing the semiconductor memory device can be realized in which the reliability is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device, comprising:
a first semiconductor pillar extending in a first direction;
a second semiconductor pillar extending in the first direction, the first semiconductor pillar and the second semiconductor pillar being arranged in a second direction crossing the first direction;
a third semiconductor pillar extending in the first direction, the third semiconductor pillar and the first semiconductor pillar being arranged in a third direction crossing the first direction and the second direction;
a fourth semiconductor pillar extending in the first direction, the third semiconductor pillar and the fourth semiconductor pillar being arranged in the second direction, the fourth semiconductor pillar and the second semiconductor pillar being arranged in the third direction;
a first electrode extending in the third direction;
a second electrode provided between the first semiconductor pillar and the first electrode;
a third electrode extending in the third direction;
a fourth electrode provided between the second semiconductor pillar and the third electrode;
a first insulating film provided between the first semiconductor pillar and the second electrode;
a second insulating film provided between the first electrode and the second electrode;
a third insulating film provided between the second semiconductor pillar and the fourth electrode; and
a first insulating layer being provided between the first semiconductor pillar and the second semiconductor pillar, the first insulating layer continuously extending to be further provided between the third semiconductor pillar and the fourth semiconductor pillar, the first insulating layer extending in the third direction,
the second electrode including
a thin sheet portion disposed on the first electrode side, the thin sheet portion including a first face, and
a thick sheet portion disposed on the first semiconductor pillar side, a length in the first direction of the thick sheet portion being longer than a length in the first direction of the thin sheet portion, the thick sheet portion including a second face, a third face and a fourth face, the second face and the third face being apart from the first face, a first distance between the first face and the first insulating film being longer than a second distance between the second face and the first insulating film and a third distance between the third face and the first insulating film, and the fourth face being contact with the first insulating film, the second insulating film including
a first layer being contact with the first face, the second face, and the third face, and
a second layer disposed between the first layer and the first electrode and on two first-direction sides of the first electrode, wherein an electrode is not provided between the first semiconductor pillar and the second semiconductor pillar and an electrode is not provided between the first semiconductor pillar and the third semiconductor pillar.

2. The device according to claim 1, wherein
the first layer is disposed between the thin sheet portion and the first electrode and on two first-direction sides of the thin sheet portion; and
a portion of the first layer extends in the second direction.

3. The device according to claim 1, wherein a portion of the second layer is disposed on two first-direction sides of the first layer.

4. The device according to claim 3, wherein a portion of the first electrode is disposed on the two first-direction sides of the first layer.

5. The device according to claim 1, wherein
the first layer includes:
an outer layer contacting the second layer;
an inner layer contacting the second electrode; and
a metal particle disposed between the outer layer and the inner layer.

6. The device according to claim 1, further comprising:
a fifth semiconductor pillar extending in the first direction, the first semiconductor pillar being provided between the second semiconductor pillar and the fifth semiconductor pillar in the second direction;
a fifth electrode provided between the first electrode and the fifth semiconductor pillar, the fifth electrode extending in the third direction; and
a second insulating layer being provided between the first electrode and the fifth electrode, the second insulating layer extending in the first and third directions,
wherein the first electrode is provided between the first semiconductor pillar and the fifth semiconductor pillar.

7. A semiconductor memory device, comprising:
a first semiconductor pillar extending in a first direction;
a second semiconductor pillar extending in the first direction, the first semiconductor pillar and the second semiconductor pillar being arranged in a second direction crossing the first direction;
a third semiconductor pillar extending in the first direction, the third semiconductor pillar and the first semiconductor pillar being arranged in a third direction crossing the first direction and the second direction;
a fourth semiconductor pillar extending in the first direction, the third semiconductor pillar and the fourth semiconductor pillar being arranged in the second direction, the fourth semiconductor pillar and the second semiconductor pillar being arranged in the third direction;
a first electrode extending in the third direction;
a second electrode provided between the semiconductor pillar and the first electrode;
a third electrode extending in the third direction;
a fourth electrode provided between the second semiconductor pillar and the third electrode;
a first insulating film provided between the first semiconductor pillar and the second electrode;
a second insulating film provided between the first electrode and the second electrode;
a third insulating film provided between the second semiconductor pillar and the fourth electrode; and
a first insulating layer being provided between the first semiconductor pillar and the second semiconductor pillar, the first insulating layer being provided between the third semiconductor pillar and the fourth semiconductor pillar, the first insulating film extending in the third direction,
the second electrode including a first face, a second face, a third face and a fourth face, the second face and the third face being apart from the first face, a first distance between the first face and the first insulating film being longer than a second distance between the second face and the first insulating film and a third distance between the third face and the first insulating film, and the fourth face being contact with the first insulating film, the second insulating film including
a first layer disposed on the first electrode side of the second electrode and on two first-direction sides of the second electrode, the first layer being contact with the first face, the second face, and the third face,
a second layer disposed between the first layer and the first electrode and on two first-direction sides of the first electrode, and
a third layer disposed between the first electrode and the second layer,
a portion of the second layer being disposed on two first-direction sides of the first layer,
wherein an electrode is not provided between the first semiconductor pillar and the second semiconductor pillar and an electrode is not provided between the first semiconductor pillar and the third semiconductor pillar.

8. The device according to claim 7, wherein a portion of the third layer is disposed on the two first-direction sides of the first layer.

9. The device according to claim 7, further comprising:
a fifth semiconductor pillar extending in the first direction, the first semiconductor pillar being provided between the second semiconductor pillar and the fifth semiconductor pillar in the second direction;
a fifth electrode provided between the first electrode and the fifth semiconductor pillar, the fifth electrode extending in the third direction; and
a second insulating layer being provided between the first electrode and the fifth electrode, the second insulating layer extending in the first and third directions,
wherein the first electrode is provided between the first semiconductor pillar and the fifth semiconductor pillar.

10. A semiconductor memory device, comprising:
a first semiconductor pillar extending in a first direction;
a second semiconductor pillar extending in the first direction, the first semiconductor pillar and the second semiconductor pillar being arranged in a second direction crossing the first direction;
a third semiconductor pillar extending in the first direction, the third semiconductor pillar and the first semiconductor pillar being arranged in a third direction crossing the first direction and the second direction;
a fourth semiconductor pillar extending in the first direction, the third semiconductor pillar and the fourth semiconductor pillar being arranged in the second direction, the fourth semiconductor pillar and the second semiconductor pillar being arranged in the third direction;
a first electrode extending in the third direction;

a second electrode provided between the first semiconductor pillar and the first electrode;
a third electrode extending in the third direction;
a fourth electrode provided between the second semiconductor pillar and the third electrode;
a first insulating film provided between the first semiconductor pillar and the second electrode;
a second insulating film provided between the first electrode and the second electrode;
a third insulating film provided between the second semiconductor pillar and the fourth electrode; and
a first insulating layer being provided between the first semiconductor pillar and the second semiconductor pillar, the first insulating layer being provided between the third semiconductor pillar and the fourth semiconductor pillar, the first insulating film extending in the third direction,
the second insulating film including
  a first layer disposed on the first electrode side of the second electrode and on two first-direction sides of the second electrode,
  a second layer disposed between the first layer and the first electrode and on two first-direction sides of the first electrode, and
  a third layer disposed between the first electrode and the second layer;
a portion of the second layer being disposed on two first-direction sides of the first layer;
wherein a portion of the third layer is disposed on the two first-direction sides of the first layer;
wherein a portion of the first electrode is disposed on the two first-direction sides of the first layer, and
wherein an electrode is not provided between the first semiconductor pillar and the second semiconductor pillar and an electrode is not provided between the first semiconductor pillar and the third semiconductor pillar.

11. The device according to claim 10, further comprising:
a fifth semiconductor pillar extending in the first direction, the first semiconductor pillar being provided between the second semiconductor pillar and the fifth semiconductor pillar in the second direction;
a fifth electrode provided between the first electrode and the fifth semiconductor pillar, the fifth electrode extending in the third direction; and
a second insulating layer being provided between the first electrode and the fifth electrode, the second insulating layer extending in the first and third directions,
wherein the first electrode is provided between the first semiconductor pillar and the fifth semiconductor pillar.

* * * * *